(12) United States Patent
Tobiassen et al.

(10) Patent No.: US 11,950,397 B2
(45) Date of Patent: Apr. 2, 2024

(54) COOLING SOLUTIONS FOR AUTONOMOUS VEHICLES

(71) Applicant: MOTIONAL AD LLC, Boston, MA (US)

(72) Inventors: Thorin Tobiassen, Pittsburgh, PA (US); Andrew Timothy Moore, Pittsburgh, PA (US); Gaurav Bhatia, Pittsburgh, PA (US); Christopher P. Bird, Carnegie, PA (US)

(73) Assignee: Motional AD LLC, Boston, MA (US)

( * ) Notice: Subject to any disclaimer, the term of this patent is extended or adjusted under 35 U.S.C. 154(b) by 797 days.

(21) Appl. No.: 17/002,289

(22) Filed: Aug. 25, 2020

(65) Prior Publication Data

US 2021/0068312 A1    Mar. 4, 2021

Related U.S. Application Data

(60) Provisional application No. 62/892,332, filed on Aug. 27, 2019.

(51) Int. Cl.
*H05K 7/20* (2006.01)
*B60H 1/00* (2006.01)

(52) U.S. Cl.
CPC ..... *H05K 7/20863* (2013.01); *H05K 7/20209* (2013.01); *H05K 7/20281* (2013.01); *H05K 7/20872* (2013.01); *B60H 2001/00614* (2013.01)

(58) Field of Classification Search
CPC ........... H05K 7/20863; H05K 7/20209; H05K 7/20281; H05K 7/20872; B60H 2001/00614; B60H 1/039; B60H 1/143; B60H 1/00271; B60H 2001/00178; B60H 2001/003

See application file for complete search history.

(56) References Cited

U.S. PATENT DOCUMENTS

| 4,658,599 A | 4/1987 | Kajiwara |
| 5,814,908 A | 9/1998 | Muszynski |
| 5,937,664 A | 8/1999 | Matsuno et al. |

(Continued)

FOREIGN PATENT DOCUMENTS

| CN | 201365389 Y | 12/2009 |
| CN | 202310418 U | 7/2012 |

(Continued)

OTHER PUBLICATIONS

SAE On-Road Automated Vehicle Standards Committee, "SAE International's Standard J3016: Taxonomy and Definitions for Terms Related to Driving Automation Systems for On-Road Motor Vehicles", Jun. 2018, in 35 pages.

(Continued)

*Primary Examiner* — Edelmira Bosques
*Assistant Examiner* — Michael James Giordano
(74) *Attorney, Agent, or Firm* — Knobbe, Martens, Olson & Bear, LLP

(57) ABSTRACT

The subject matter described in this specification is directed to systems and methods for dissipating heat from electronic components supporting autonomous vehicle systems. In particular, the specification describes how the electronic components can be positioned in a duct through which conditioned cabin air can be drawn to convectively dissipate heat from the electronic components.

19 Claims, 16 Drawing Sheets

(56) References Cited

U.S. PATENT DOCUMENTS

| | | | |
|---|---|---|---|
| 8,206,204 B2 * | 6/2012 | Bryant | B60H 1/00735 454/75 |
| 8,319,408 B1 | 11/2012 | Horng | |
| 8,527,095 B2 | 9/2013 | Kikuchi et al. | |
| 9,914,336 B2 | 3/2018 | Smith | |
| 10,729,034 B2 | 7/2020 | Zaindl et al. | |
| 2006/0102403 A1 | 5/2006 | Inoguchi et al. | |
| 2007/0095086 A1 | 5/2007 | Tsuneishi et al. | |
| 2008/0062038 A1 | 3/2008 | Ouchi et al. | |
| 2008/0139102 A1 | 6/2008 | Major | |
| 2009/0199997 A1 | 8/2009 | Koplow | |
| 2010/0117480 A1 | 5/2010 | Ishizuka et al. | |
| 2011/0083446 A1 | 4/2011 | Pinet | |
| 2011/0165830 A1 * | 7/2011 | Smith | B60H 1/00278 454/75 |
| 2011/0165832 A1 | 7/2011 | Smith | |
| 2013/0052490 A1 | 2/2013 | TenHouten et al. | |
| 2013/0215571 A1 | 8/2013 | Miyamoto et al. | |
| 2013/0337296 A1 | 12/2013 | Cardoso | |
| 2015/0055297 A1 | 2/2015 | Chilek et al. | |
| 2016/0159246 A1 | 6/2016 | Jung et al. | |
| 2017/0174037 A1 | 6/2017 | Meyhofer et al. | |
| 2017/0261273 A1 | 9/2017 | Maranville et al. | |
| 2017/0297407 A1 | 10/2017 | Shan et al. | |
| 2018/0109061 A1 | 4/2018 | Pardhan et al. | |
| 2018/0335622 A1 | 11/2018 | Trebouet et al. | |
| 2018/0345758 A1 * | 12/2018 | Oh | B60L 58/26 |
| 2019/0154799 A1 | 5/2019 | Schmidt | |
| 2019/0278078 A1 | 9/2019 | Krishnan et al. | |
| 2020/0094647 A1 | 3/2020 | Shibata et al. | |
| 2021/0063093 A1 | 3/2021 | Tobiassen et al. | |

FOREIGN PATENT DOCUMENTS

| | | | | |
|---|---|---|---|---|
| CN | 103458653 A | | 12/2013 | |
| CN | 204014404 U | | 12/2014 | |
| CN | 104766478 A | | 7/2015 | |
| CN | 204761102 U | | 11/2015 | |
| CN | 105392674 A | | 3/2016 | |
| CN | 208046472 U | | 11/2018 | |
| CN | 208168965 U | | 11/2018 | |
| CN | 109237427 A | | 1/2019 | |
| CN | 208962866 U | | 6/2019 | |
| DE | 102013004007 A1 | * | 9/2014 | H05K 7/20209 |
| EP | 1473193 A1 | | 11/2004 | |
| EP | 2548754 A1 | | 1/2013 | |
| EP | 2730453 A2 | | 5/2014 | |
| JP | 2002254924 A | * | 9/2002 | |
| JP | 2003326961 A | * | 11/2003 | |
| JP | 2008-055929 A | | 3/2008 | |
| JP | 2008-055990 A | | 3/2008 | |
| JP | 2008-247340 A | | 10/2008 | |
| JP | 2008-247341 A | | 10/2008 | |
| JP | 2011-249495 A | | 12/2011 | |
| JP | 2014-168982 A | | 9/2014 | |
| JP | 2016-205851 A | | 12/2016 | |
| KR | 10-2008-0045377 A | | 5/2008 | |
| KR | 20080045377 A | * | 5/2008 | |
| KR | 10-2014-0072458 A | | 6/2014 | |
| KR | 10-2018-0078794 A | | 7/2018 | |
| TW | 453470 U | | 9/2001 | |
| WO | WO 2013/180270 A1 | | 12/2013 | |
| WO | WO 2016/051249 A2 | | 4/2016 | |
| WO | WO 2017/213573 A1 | | 12/2017 | |

OTHER PUBLICATIONS

Great Britain Office Action issued for Application No. GB 2013334.4, dated Feb. 16, 2021.
Great Britain Office Action issued for Application No. GB 2013334.4, dated Nov. 11, 2021.
Chinese Office Action issued for Application No. CN 202010885704.7 dated Aug. 16, 2021.
Great Britain Office Action issued for Application No. GB 2013337.7, dated Feb. 8, 2021.
Great Britain Office Action issued for Application No. GB 2013337.7, dated Nov. 26, 2021.
Great Britain Office Action issued for Application No. GB 2118022.9, dated Jan. 10, 2022.
Korean Office Action issued for Application No. KR 10-2020-0108805, dated Nov. 29, 2021.
Korean Office Action issued for Application No. 10-2020-0107949, dated Jan. 30, 2022.
Chinese Office Action issued for Application No. CN 202010885704.7 dated Mar. 29, 2022.
Chinese Office Action issued for Application No. CN 202010885704.7 dated May 30, 2022.
Chinese Office Action issued for Application No. CN 202010877870.2 dated Oct. 11, 2023.
Great Britain Office Action issued for Application No. GB 2202882.3, dated Aug. 12, 2022.
Great Britain Office Action issued for Application No. GB 2212278.2, dated Sep. 7, 2022.
Korean Notice of Allowance issued for Application No. KR 10-2020-0108805, dated Jun. 22, 2022.
Korean Office Action issued for Application No. 10-2020-0107949, dated Aug. 30, 2022.
Korean Office Action issued for Application No. 10-2020-0107949, dated Mar. 27, 2023.

* cited by examiner

COOLING SOLUTIONS FOR AUTONOMOUS VEHICLES

CROSS-REFERENCE TO RELATED APPLICATIONS

This application claims the benefit of U.S. Provisional Application No. 62/892,332, entitled "COOLING SOLUTIONS FOR AUTONOMOUS VEHICLES," filed Aug. 27, 2019, the entire contents of which are hereby incorporated by reference.

FIELD

This description relates to a system for cooling electronic components in a vehicle, and in particular, augmenting an existing vehicular cooling system to provide targeted cooling for electronics supporting autonomous driving systems.

BACKGROUND

Autonomous vehicles can be used to transport people and/or cargo (e.g., packages, objects, or other items) from one location to another. For example, an autonomous vehicle can navigate to the location of a person, wait for the person to board the autonomous vehicle, and navigate to a specified destination (e.g., a location selected by the person). To navigate in the environment, these autonomous vehicles are equipped with various types of sensors and electronics to detect and characterize objects in the surroundings.

SUMMARY

Presently, vehicles retrofitted with autonomous driving solutions are not well configured to dissipate heat generated by the electronics supporting the autonomous systems. For this reason, ways of augmenting cooling systems of the retrofitted vehicles are desirable.

The subject matter described in this specification is directed to systems and methods for dissipating heat from a computer system in a vehicle, and in particular, a computer system configured to support autonomous driving functionality. In some embodiments, the computer system is configured to receive input from one or more sensors of the vehicle, detect one or more objects in the environment surrounding the vehicle based on the received input, and operate the vehicle based upon the detection of the objects.

An example technique for controlling the temperature of electronic components in a vehicle includes: operating an environmental control system of the vehicle according to a first set of operating parameters, wherein the environmental control system is configured to control air flow to an interior portion of the vehicle and to direct air from the interior portion of the vehicle to the electronic components, and wherein operating the environmental control system according to the first set of parameters is configured to cause the air directed to the electronic components to dissipate heat from the electronic components at a first rate; obtaining first data representing a temperature of the electronic components; obtaining second data representing a state of the vehicle different from the temperature of the electronic components; and in accordance with a determination that the temperature of the electronic components and the state of the vehicle satisfy predetermined criteria, operating the environmental control system according to a second set of operating parameters configured to cause the air directed to the electronic components to dissipate heat from the electronic components at a second rate different from the first rate.

These and other aspects, features, and implementations can be expressed as methods, apparatuses, systems, components, program products, means or steps for performing a function, and in other ways.

These and other aspects, features, and implementations will become apparent from the following descriptions, including the claims.

DETAILED DESCRIPTION

Figure 1:
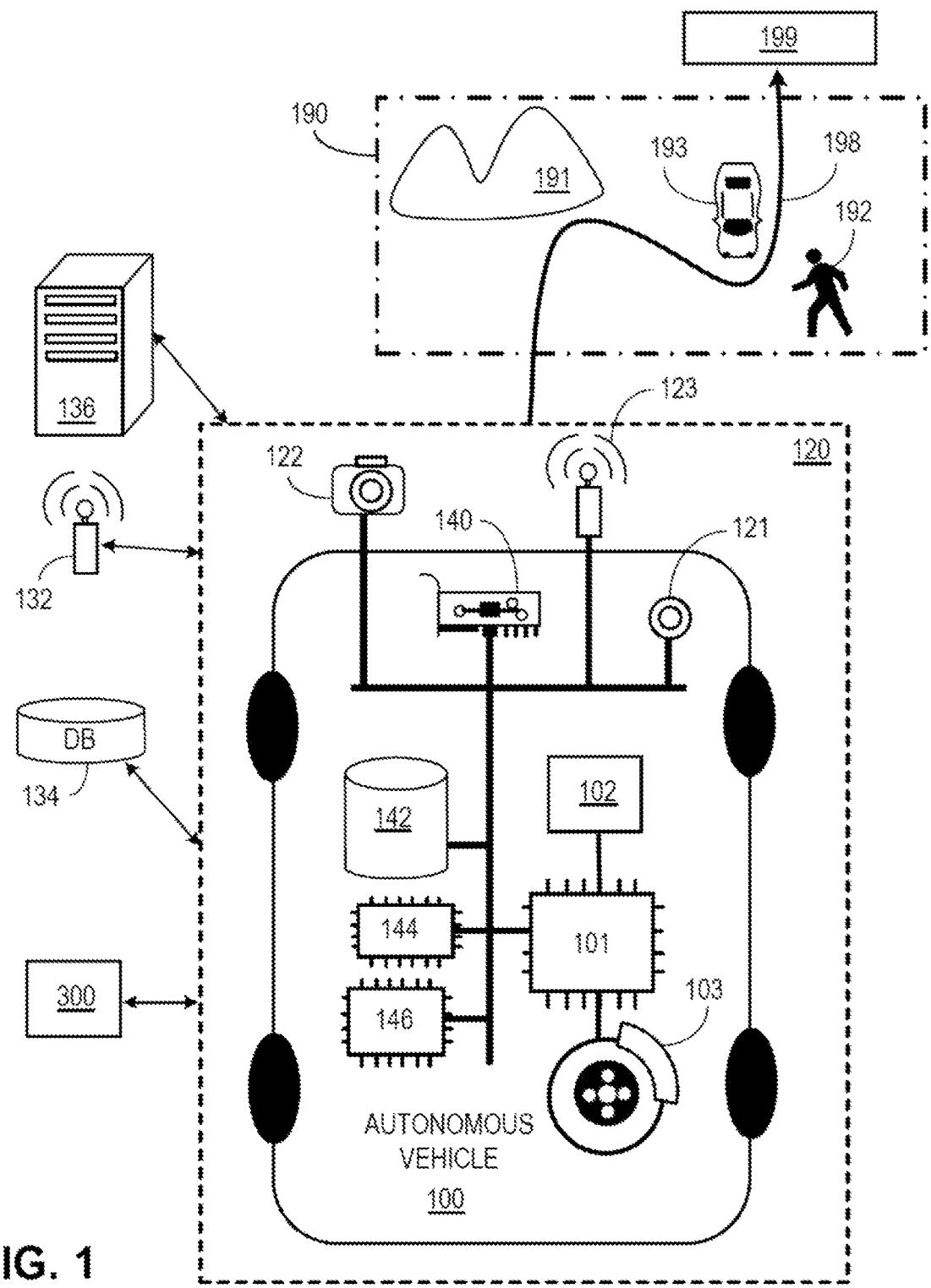
FIG. 1 shows an example of an autonomous vehicle having autonomous capability.

In the following description, for the purposes of explanation, numerous specific details are set forth. It will be apparent, however, that the disclosed techniques may be practiced without these specific details. In other instances, well-known structures and devices are shown in block diagram form in order to avoid unnecessarily obscuring the disclosed techniques.

In the drawings, specific arrangements or orderings of schematic elements, such as those representing devices, modules, instruction blocks and data elements, are shown for ease of description. However, it should be understood by those skilled in the art that the specific ordering or arrangement of the schematic elements in the drawings is not meant to imply that a particular order or sequence of processing, or separation of processes, is required. Further, the inclusion of a schematic element in a drawing is not meant to imply that such element is required in all embodiments or that the features represented by such element may not be included in or combined with other elements in some embodiments.

Further, in the drawings, where connecting elements, such as solid or dashed lines or arrows, are used to illustrate a connection, relationship, or association between or among two or more other schematic elements, the absence of any such connecting elements is not meant to imply that no connection, relationship, or association can exist. In other words, some connections, relationships, or associations between elements are not shown in the drawings so as not to obscure the disclosure. In addition, for ease of illustration, a single connecting element is used to represent multiple connections, relationships or associations between elements. For example, where a connecting element represents a communication of signals, data, or instructions, it should be understood by those skilled in the art that such element represents one or multiple signal paths (e.g., a bus), as may be needed, to affect the communication.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Several features are described hereafter that can each be used independently of one another or with any combination of other features. However, any individual feature may not address any of the problems discussed above or might only address one of the problems discussed above. Some of the problems discussed above might not be fully addressed by any of the features described herein. Although headings are provided, information related to a particular heading, but not found in the section having that heading, may also be found elsewhere in this description. Embodiments are described herein according to the following outline:

1. General Overview
2. Hardware Overview
3. Autonomous Vehicle Architecture
4. Autonomous Vehicle Inputs
5. Autonomous Vehicle Planning
6. Autonomous Vehicle Control
7. Computing System for Object Detection Using Pillars
8. Example Point Clouds and Pillars
9. Example Process for Detecting Objects and Operating the Vehicle Based on the Detection of the Objects General Overview Autonomous vehicles driving in complex environments (e.g., an urban environment) pose a great technological challenge. In order for autonomous vehicles to navigate these environments, the vehicles detect various types of objects such as vehicles, pedestrians, and bikes in real-time using sensors such as LIDAR or RADAR. The electronic components capable of providing the processing power needed to detect and characterize various objects surrounding the vehicle can generate substantial amounts of heat. For this reason, the autonomous vehicles tend to need robust temperature regulating systems to dissipate the heat generated by these electronic components. One approach for dissipating the heat generated by these electronic components in a vehicle that was not initially designed to dissipate the additional heat, is to augment an existing environmental control system to handle the additional a temperature regulating system capable of dissipating the heat In particular, the systems and techniques described herein are implemented using a combination of control systems and custom ducting to provide a desired amount of heat dissipation for a vehicle retrofitted with autonomous control systems. In some embodiments, an interior portion of a vehicle is divided into at least a cabin area and a concealed compartment where the electronic components supporting the autonomous control systems are placed to minimize any danger of passengers or cargo within the cabin area from interacting with or in extreme cases accidentally doing damage to the electronic components. The concealed compartment can be linked to the existing environmental control system by a series of ducts so that the electronic components can be cooled at least in part by the existing environmental control system. It should be noted that in some embodiments, the electronic components are placed in the cabin area in a location that is unlikely to be impacted by passengers or cargo.

Since air within a cabin area of the autonomous vehicle is generally cooler than the operating temperature of the electronic components, the conditioned cabin air can be used to convectively dissipate heat from the electronic components. This is achieved by positioning a first end of the ducting linking the compartment to the existing environmental control system at an opening in an interior wall of the autonomous vehicle to form a cabin air intake or entry point allowing for the conditioned cabin air to flow or be drawn into the ducting. A second end of the ducting attaches to the existing environmental control system to form an exit point and a central portion of the ducting surrounds and encloses the electronic components within the concealed compartment. In this way, a blower of the existing environmental control system can be configured to draw conditioned air from the cabin area into the first end of the ducting, across the electrical components to convectively dissipate heat, and into the existing environmental control system where the now heated air can be cooled before being reintroduced into the cabin. Additional fans can be positioned within the ducting to further facilitate the flow of conditioned cabin air through the ducting.

Additional features can be built into the system. For example, in instances where the air being used to dissipate heat from the electrical components is heated too intensely the heated air can be exhausted to the ambient environment instead of attempting to cool the air back down to a temperature suitable for reintroduction into the cabin area. In some embodiments, the convective heat dissipation can be augmented by a liquid cooling loop that employs a heat exchanger to carry heat dissipated by electronic components equipped with liquid cooling ports back to the environmental control system. In some embodiments, the ducting only connects to a rear portion of an autonomous vehicle's environmental control system. In such a case, a cooling output of the forward portion of the environmental system can be increased to keep the cabin area comfortable when the rear portion is overtasked with keeping the electronic components from overheating.

In some embodiments, certain ranges of cabin temperature and fan speeds may be restricted under certain circumstances. For example, the environmental control system may be unable to achieve a sufficiently low temperature when dissipating large amounts of heat from the electronic components. Furthermore, the environmental system may reduce a maximum selectable temperature within the cabin since conditioned cabin air is what is used to provide cooling to the electronic components. Other control restrictions may also apply and are described in greater detail below.

Hardware Overview

FIG. 1 shows an example of an autonomous vehicle 100 having autonomous capability.

As used herein, the term "autonomous capability" refers to a function, feature, or facility that enables a vehicle to be partially or fully operated without real-time human intervention, including without limitation fully autonomous vehicles, highly autonomous vehicles, and conditionally autonomous vehicles.

As used herein, an autonomous vehicle (AV) is a vehicle that possesses autonomous capability.

As used herein, "vehicle" includes means of transportation of goods or people. For example, cars, buses, trains, airplanes, drones, trucks, boats, ships, submersibles, dirigibles, etc. A driverless car is an example of a vehicle.

As used herein, "trajectory" refers to a path or route to navigate an AV from a first spatiotemporal location to second spatiotemporal location. In an embodiment, the first spatiotemporal location is referred to as the initial or starting location and the second spatiotemporal location is referred to as the destination, final location, goal, goal position, or goal location. In some examples, a trajectory is made up of one or more segments (e.g., sections of road) and each segment is made up of one or more blocks (e.g., portions of a lane or intersection). In an embodiment, the spatiotemporal locations correspond to real world locations. For example, the spatiotemporal locations are pick up or drop-off locations to pick up or drop-off persons or goods.

As used herein, "sensor(s)" includes one or more hardware components that detect information about the environment surrounding the sensor. Some of the hardware components can include sensing components (e.g., image sensors, biometric sensors), transmitting and/or receiving components (e.g., laser or radio frequency wave transmitters and receivers), electronic components such as analog-to-digital converters, a data storage device (such as a RAM and/or a nonvolatile storage), software or firmware components and data processing components such as an ASIC (application-specific integrated circuit), a microprocessor and/or a microcontroller.

As used herein, a "scene description" is a data structure (e.g., list) or data stream that includes one or more classified or labeled objects detected by one or more sensors on the AV vehicle or provided by a source external to the AV.

As used herein, a "road" is a physical area that can be traversed by a vehicle, and may correspond to a named thoroughfare (e.g., city street, interstate freeway, etc.) or may correspond to an unnamed thoroughfare (e.g., a driveway in a house or office building, a section of a parking lot, a section of a vacant lot, a dirt path in a rural area, etc.). Because some vehicles (e.g., 4-wheel-drive pickup trucks, sport utility vehicles, etc.) are capable of traversing a variety of physical areas not specifically adapted for vehicle travel, a "road" may be a physical area not formally defined as a thoroughfare by any municipality or other governmental or administrative body.

As used herein, a "lane" is a portion of a road that can be traversed by a vehicle, and may correspond to most or all of the space between lane markings, or may correspond to only some (e.g., less than 50%) of the space between lane markings. For example, a road having lane markings spaced far apart might accommodate two or more vehicles between the markings, such that one vehicle can pass the other without traversing the lane markings, and thus could be interpreted as having a lane narrower than the space between the lane markings, or having two lanes between the lane markings. A lane could also be interpreted in the absence of lane markings. For example, a lane may be defined based on physical features of an environment, e.g., rocks and trees along a thoroughfare in a rural area.

"One or more" includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact, unless specified otherwise.

The terminology used in the description of the various described embodiments herein is for the purpose of describing particular embodiments only and is not intended to be limiting. As used in the description of the various described embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this description, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

As used herein, an AV system refers to the AV along with the array of hardware, software, stored data, and data generated in real-time that supports the operation of the AV. In an embodiment, the AV system is incorporated within the AV. In an embodiment, the AV system is spread across several locations. For example, some of the software of the AV system is implemented on a cloud computing environment similar to cloud computing environment 200 described below with respect to FIG. 2.

In general, this document describes technologies applicable to any vehicles that have one or more autonomous capabilities including fully autonomous vehicles, highly autonomous vehicles, and conditionally autonomous vehicles, such as so-called Level 5, Level 4 and Level 3 vehicles, respectively (see SAE International's standard J3016: Taxonomy and Definitions for Terms Related to On-Road Motor Vehicle Automated Driving Systems, which is incorporated by reference in its entirety, for more details on the classification of levels of autonomy in vehicles). The technologies described in this document are also applicable to partially autonomous vehicles and driver assisted vehicles, such as so-called Level 2 and Level 1 vehicles (see SAE International's standard J3016: Taxonomy and Definitions for Terms Related to On-Road Motor Vehicle Automated Driving Systems). In an embodiment, one or more of the Level 1, 2, 3, 4 and 5 vehicle systems may automate certain vehicle operations (e.g., steering, braking, and using maps) under certain operating conditions based on processing of sensor inputs. The technologies described in this document can benefit vehicles in any levels, ranging from fully autonomous vehicles to human-operated vehicles.

Referring to FIG. 1, an AV system 120 operates the AV 100 along a trajectory 198 through an environment 190 to a destination 199 (sometimes referred to as a final location) while avoiding objects (e.g., natural obstructions 191, vehicles 193, pedestrians 192, cyclists, and other obstacles) and obeying rules of the road (e.g., rules of operation or driving preferences).

In an embodiment, the AV system 120 includes devices 101 that are instrumented to receive and act on operational commands from the computer processors 146. In an embodiment, computing processors 146 are similar to the processor 304 described below in reference to FIG. 3. Examples of devices 101 include a steering control 102, brakes 103, gears, accelerator pedal or other acceleration control mechanisms, windshield wipers, side-door locks, window controls, and turn-indicators.

In an embodiment, the AV system 120 includes sensors 121 for measuring or inferring properties of state or condition of the AV 100, such as the AV's position, linear and angular velocity and acceleration, and heading (e.g., an orientation of the leading end of AV 100). Example of sensors 121 are GPS, inertial measurement units (IMU) that measure both vehicle linear accelerations and angular rates, wheel speed sensors for measuring or estimating wheel slip ratios, wheel brake pressure or braking torque sensors, engine torque or wheel torque sensors, and steering angle and angular rate sensors.

In an embodiment, the sensors 121 also include sensors for sensing or measuring properties of the AV's environment. For example, monocular or stereo video cameras 122 in the visible light, infrared or thermal (or both) spectra, LiDAR 123, RADAR, ultrasonic sensors, time-of-flight (TOF) depth sensors, speed sensors, temperature sensors, humidity sensors, and precipitation sensors.

In an embodiment, the AV system 120 includes a data storage unit 142 and memory 144 for storing machine instructions associated with computer processors 146 or data collected by sensors 121. In an embodiment, the data storage unit 142 is similar to the ROM 308 or storage device 310 described below in relation to FIG. 3. In an embodiment, memory 144 is similar to the main memory 306 described below. In an embodiment, the data storage unit 142 and memory 144 store historical, real-time, and/or predictive information about the environment 190. In an embodiment, the stored information includes maps, driving performance, traffic congestion updates or weather conditions. In an embodiment, data relating to the environment 190 is transmitted to the AV 100 via a communications channel from a remotely located database 134.

In an embodiment, the AV system 120 includes communications devices 140 for communicating measured or inferred properties of other vehicles' states and conditions, such as positions, linear and angular velocities, linear and angular accelerations, and linear and angular headings to the AV 100. These devices include Vehicle-to-Vehicle (V2V) and Vehicle-to-Infrastructure (V2I) communication devices and devices for wireless communications over point-to-point or ad hoc networks or both. In an embodiment, the communications devices 140 communicate across the electromagnetic spectrum (including radio and optical communications) or other media (e.g., air and acoustic media). A combination of Vehicle-to-Vehicle (V2V) Vehicle-to-Infrastructure (V2I) communication (and, in some embodiments, one or more other types of communication) is sometimes referred to as Vehicle-to-Everything (V2X) communication. V2X communication typically conforms to one or more communications standards for communication with, between, and among autonomous vehicles.

In an embodiment, the communication devices 140 include communication interfaces. For example, wired, wireless, WiMAX, WiFi, Bluetooth, satellite, cellular, optical, near field, infrared, or radio interfaces. The communication interfaces transmit data from a remotely located database 134 to AV system 120. In an embodiment, the remotely located database 134 is embedded in a cloud computing environment 200 as described in FIG. 2. The communication interfaces 140 transmit data collected from sensors 121 or other data related to the operation of AV 100 to the remotely located database 134. In an embodiment, communication interfaces 140 transmit information that relates to teleoperations to the AV 100. In some embodiments, the AV 100 communicates with other remote (e.g., "cloud") servers 136.

In an embodiment, the remotely located database 134 also stores and transmits digital data (e.g., storing data such as road and street locations). Such data is stored on the memory 144 on the AV 100, or transmitted to the AV 100 via a communications channel from the remotely located database 134.

In an embodiment, the remotely located database 134 stores and transmits historical information about driving properties (e.g., speed and acceleration profiles) of vehicles that have previously traveled along trajectory 198 at similar times of day. In one implementation, such data may be stored on the memory 144 on the AV 100, or transmitted to the AV 100 via a communications channel from the remotely located database 134.

Computing devices 146 located on the AV 100 algorithmically generate control actions based on both real-time sensor data and prior information, allowing the AV system 120 to execute its autonomous driving capabilities.

In an embodiment, the AV system 120 includes computer peripherals 132 coupled to computing devices 146 for providing information and alerts to, and receiving input from, a user (e.g., an occupant or a remote user) of the AV 100. In an embodiment, peripherals 132 are similar to the display 312, input device 314, and cursor controller 316 discussed below in reference to FIG. 3. The coupling is wireless or wired. Any two or more of the interface devices may be integrated into a single device.

Figure 2:
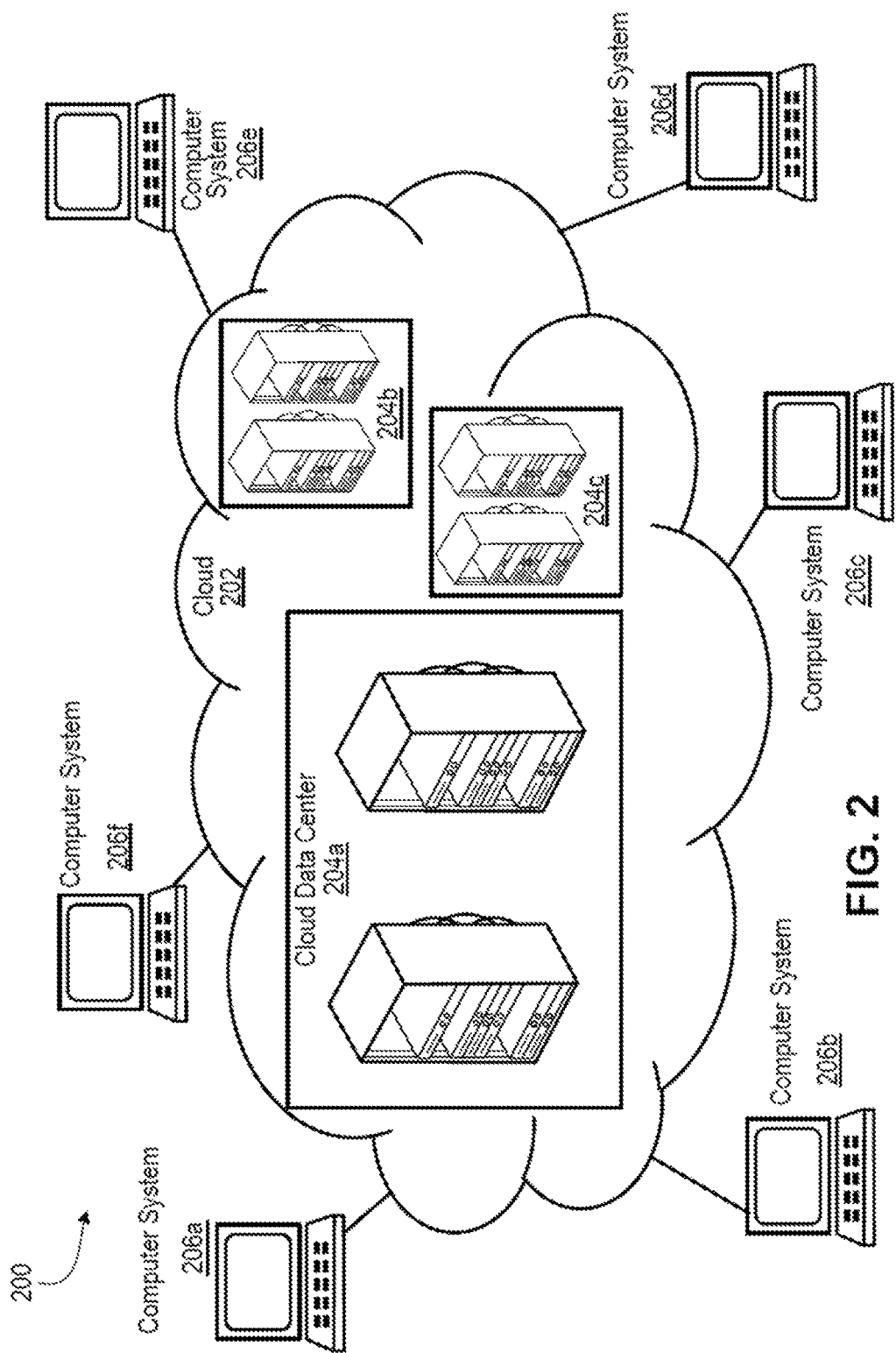
FIG. 2 illustrates an example "cloud" computing environment.

FIG. 2 illustrates an example "cloud" computing environment. Cloud computing is a model of service delivery for enabling convenient, on-demand network access to a shared pool of configurable computing resources (e.g., networks, network bandwidth, servers, processing, memory, storage, applications, virtual machines, and services). In typical cloud computing systems, one or more large cloud data centers house the machines used to deliver the services provided by the cloud. Referring now to FIG. 2, the cloud computing environment 200 includes cloud data centers 204a, 204b, and 204c that are interconnected through the cloud 202. Data centers 204a, 204b, and 204c provide cloud computing services to computer systems 206a, 206b, 206c, 206d, 206e, and 206f connected to cloud 202.

The cloud computing environment 200 includes one or more cloud data centers. In general, a cloud data center, for example the cloud data center 204a shown in FIG. 2, refers to the physical arrangement of servers that make up a cloud, for example the cloud 202 shown in FIG. 2, or a particular portion of a cloud. For example, servers are physically arranged in the cloud datacenter into rooms, groups, rows, and racks. A cloud datacenter has one or more zones, which include one or more rooms of servers. Each room has one or more rows of servers, and each row includes one or more racks. Each rack includes one or more individual server nodes. In some implementation, servers in zones, rooms, racks, and/or rows are arranged into groups based on physical infrastructure requirements of the datacenter facility, which include power, energy, thermal, heat, and/or other requirements. In an embodiment, the server nodes are similar to the computer system described in FIG. 3. The data center 204a has many computing systems distributed through many racks.

The cloud 202 includes cloud data centers 204a, 204b, and 204c along with the network and networking resources (for example, networking equipment, nodes, routers, switches, and networking cables) that interconnect the cloud data centers 204a, 204b, and 204c and help facilitate the computing systems' 206a-f access to cloud computing services. In an embodiment, the network represents any combination of one or more local networks, wide area networks, or internetworks coupled using wired or wireless links deployed using terrestrial or satellite connections. Data exchanged over the network, is transferred using any number of network layer protocols, such as Internet Protocol (IP), Multiprotocol Label Switching (MPLS), Asynchronous Transfer Mode (ATM), Frame Relay, etc. Furthermore, in embodiments where the network represents a combination of multiple sub-networks, different network layer protocols are used at each of the underlying sub-networks. In some embodiments, the network represents one or more interconnected internetworks, such as the public Internet.

The computing systems 206a-f or cloud computing services consumers are connected to the cloud 202 through network links and network adapters. In an embodiment, the computing systems 206a-f are implemented as various computing devices, for example servers, desktops, laptops, tablet, smartphones, Internet of Things (IoT) devices, autonomous vehicles (including, cars, drones, shuttles, trains, buses, etc.) and consumer electronics. In an embodiment, the computing systems 206a-f are implemented in or as a part of other systems.

Figure 3:
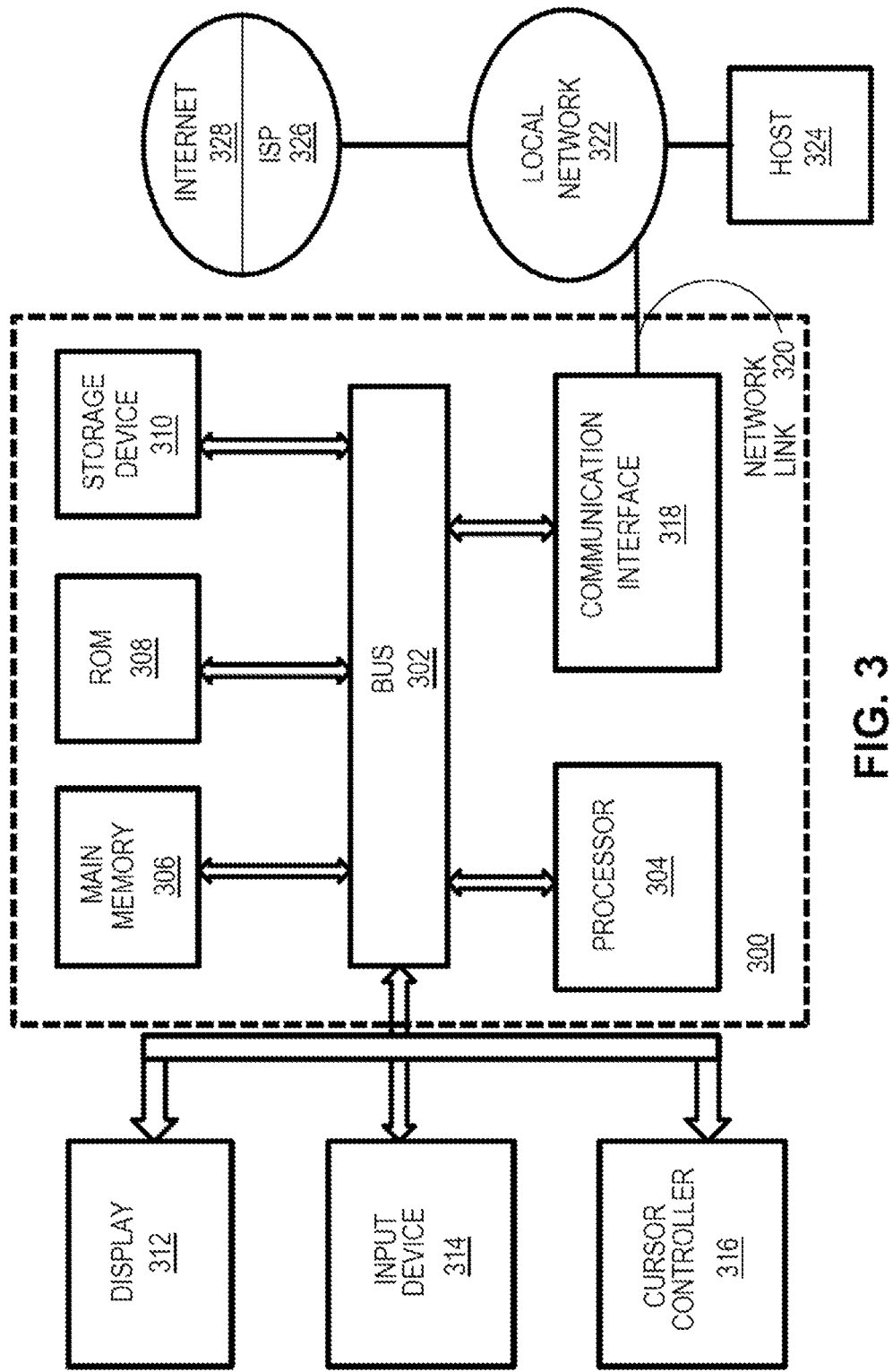
FIG. 3 illustrates a computer system.

FIG. 3 illustrates a computer system 300. In an implementation, the computer system 300 is a special purpose computing device. The special-purpose computing device is hard-wired to perform the techniques or includes digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. In various embodiments, the special-purpose computing devices are desktop computer systems, portable computer systems, handheld devices, network devices or any other device that incorporates hard-wired and/or program logic to implement the techniques.

In an embodiment, the computer system 300 includes a bus 302 or other communication mechanism for communicating information, and a hardware processor 304 coupled with a bus 302 for processing information. The hardware processor 304 is, for example, a general-purpose microprocessor. The computer system 300 also includes a main memory 306, such as a random-access memory (RAM) or other dynamic storage device, coupled to the bus 302 for storing information and instructions to be executed by processor 304. In one implementation, the main memory 306 is used for storing temporary variables or other intermediate information during execution of instructions to be executed by the processor 304. Such instructions, when stored in non-transitory storage media accessible to the processor 304, render the computer system 300 into a special-purpose machine that is customized to perform the operations specified in the instructions.

In an embodiment, the computer system 300 further includes a read only memory (ROM) 308 or other static storage device coupled to the bus 302 for storing static information and instructions for the processor 304. A storage device 310, such as a magnetic disk, optical disk, solid-state drive, or three-dimensional cross point memory is provided and coupled to the bus 302 for storing information and instructions.

In an embodiment, the computer system 300 is coupled via the bus 302 to a display 312, such as a cathode ray tube (CRT), a liquid crystal display (LCD), plasma display, light emitting diode (LED) display, or an organic light emitting diode (OLED) display for displaying information to a computer user. An input device 314, including alphanumeric and other keys, is coupled to bus 302 for communicating information and command selections to the processor 304. Another type of user input device is a cursor controller 316, such as a mouse, a trackball, a touch-enabled display, or cursor direction keys for communicating direction information and command selections to the processor 304 and for controlling cursor movement on the display 312. This input device typically has two degrees of freedom in two axes, a first axis (e.g., x-axis) and a second axis (e.g., y-axis), that allows the device to specify positions in a plane.

According to one embodiment, the techniques herein are performed by the computer system 300 in response to the processor 304 executing one or more sequences of one or more instructions contained in the main memory 306. Such instructions are read into the main memory 306 from another storage medium, such as the storage device 310. Execution of the sequences of instructions contained in the main memory 306 causes the processor 304 to perform the process steps described herein. In alternative embodiments, hard-wired circuitry is used in place of or in combination with software instructions.

The term "storage media" as used herein refers to any non-transitory media that store data and/or instructions that cause a machine to operate in a specific fashion. Such storage media includes non-volatile media and/or volatile media. Non-volatile media includes, for example, optical disks, magnetic disks, solid-state drives, or three-dimensional cross point memory, such as the storage device 310. Volatile media includes dynamic memory, such as the main memory 306. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NV-RAM, or any other memory chip or cartridge.

Storage media is distinct from but may be used in conjunction with transmission media. Transmission media participates in transferring information between storage media. For example, transmission media includes coaxial cables, copper wire and fiber optics, including the wires that comprise the bus 302. Transmission media can also take the form of acoustic or light waves, such as those generated during radio-wave and infrared data communications.

In an embodiment, various forms of media are involved in carrying one or more sequences of one or more instructions to the processor 304 for execution. For example, the instructions are initially carried on a magnetic disk or solid-state drive of a remote computer. The remote computer loads the instructions into its dynamic memory and send the instructions over a telephone line using a modem. A modem local to the computer system 300 receives the data on the telephone line and use an infrared transmitter to convert the data to an infrared signal. An infrared detector receives the data carried in the infrared signal and appropriate circuitry places the data on the bus 302. The bus 302 carries the data to the main memory 306, from which processor 304 retrieves and executes the instructions. The instructions received by the main memory 306 may optionally be stored on the storage device 310 either before or after execution by processor 304.

The computer system 300 also includes a communication interface 318 coupled to the bus 302. The communication interface 318 provides a two-way data communication coupling to a network link 320 that is connected to a local network 322. For example, the communication interface 318 is an integrated service digital network (ISDN) card, cable modem, satellite modem, or a modem to provide a data communication connection to a corresponding type of telephone line. As another example, the communication interface 318 is a local area network (LAN) card to provide a data communication connection to a compatible LAN. In some implementations, wireless links are also implemented. In any such implementation, the communication interface 318 sends and receives electrical, electromagnetic, or optical signals that carry digital data streams representing various types of information.

The network link 320 typically provides data communication through one or more networks to other data devices. For example, the network link 320 provides a connection through the local network 322 to a host computer 324 or to a cloud data center or equipment operated by an Internet Service Provider (ISP) 326. The ISP 326 in turn provides data communication services through the world-wide packet data communication network now commonly referred to as the "Internet" 328. The local network 322 and Internet 328 both use electrical, electromagnetic or optical signals that carry digital data streams. The signals through the various networks and the signals on the network link 320 and through the communication interface 318, which carry the digital data to and from the computer system 300, are example forms of transmission media. In an embodiment, the network 320 contains the cloud 202 or a part of the cloud 202 described above.

The computer system 300 sends messages and receives data, including program code, through the network(s), the network link 320, and the communication interface 318. In an embodiment, the computer system 300 receives code for processing. The received code is executed by the processor 304 as it is received, and/or stored in storage device 310, or other non-volatile storage for later execution.

Autonomous Vehicle Architecture

Figure 4:
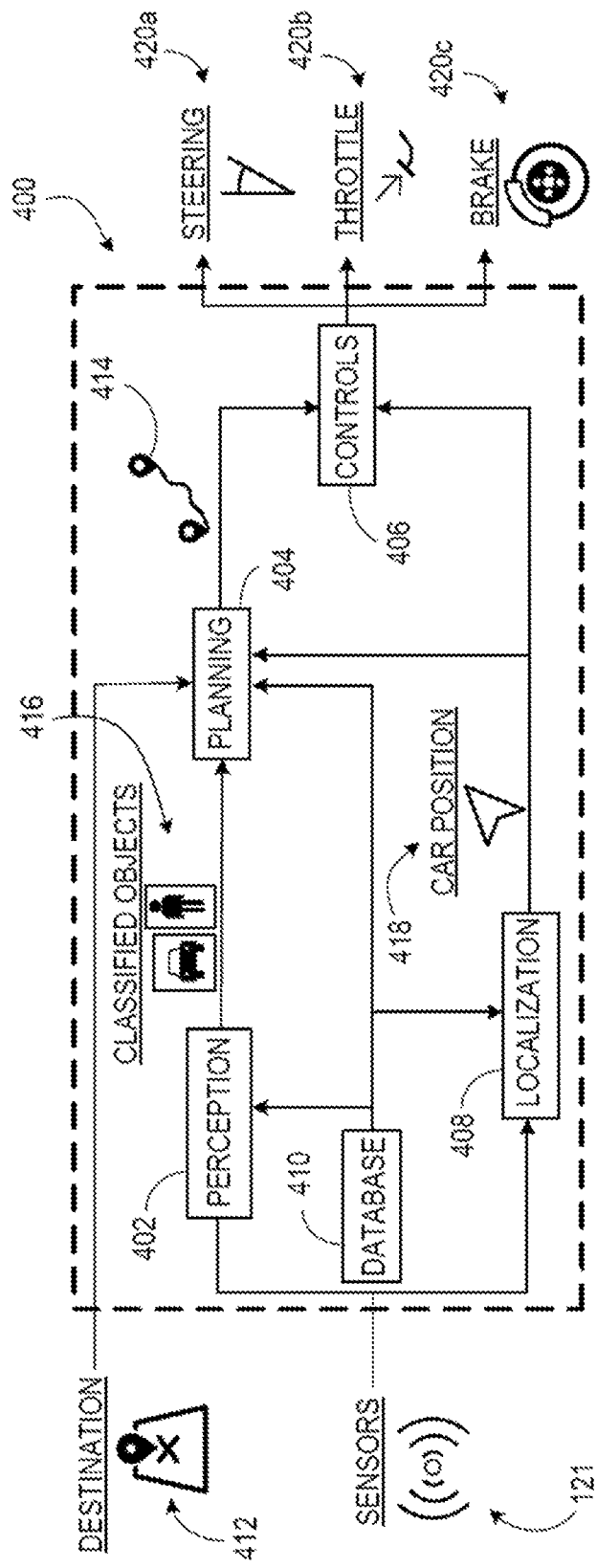
FIG. 4 shows an example architecture for an autonomous vehicle.

FIG. 4 shows an example architecture 400 for an autonomous vehicle (e.g., the AV 100 shown in FIG. 1). The architecture 400 includes a perception module 402 (sometimes referred to as a perception circuit), a planning module 404 (sometimes referred to as a planning circuit), a control module 406 (sometimes referred to as a control circuit), a localization module 408 (sometimes referred to as a localization circuit), and a database module 410 (sometimes referred to as a database circuit). Each module plays a role in the operation of the AV 100. Together, the modules 402, 404, 406, 408, and 410 may be part of the AV system 120 shown in FIG. 1. In some embodiments, any of the modules 402, 404, 406, 408, and 410 is a combination of computer software (e.g., executable code stored on a computer-readable medium) and computer hardware (e.g., one or more microprocessors, microcontrollers, application-specific integrated circuits [ASICs]), hardware memory devices, other types of integrated circuits, other types of computer hardware, or a combination of any or all of these things).

In use, the planning module 404 receives data representing a destination 412 and determines data representing a trajectory 414 (sometimes referred to as a route) that can be traveled by the AV 100 to reach (e.g., arrive at) the destination 412. In order for the planning module 404 to determine the data representing the trajectory 414, the planning module 404 receives data from the perception module 402, the localization module 408, and the database module 410.

The perception module 402 identifies nearby physical objects using one or more sensors 121, e.g., as also shown in FIG. 1. The objects are classified (e.g., grouped into types such as pedestrian, bicycle, automobile, traffic sign, etc.) and a scene description including the classified objects 416 is provided to the planning module 404.

The planning module 404 also receives data representing the AV position 418 from the localization module 408. The localization module 408 determines the AV position by using data from the sensors 121 and data from the database module 410 (e.g., a geographic data) to calculate a position. For example, the localization module 408 uses data from a GNSS (Global Navigation Satellite System) sensor and geographic data to calculate a longitude and latitude of the AV. In an embodiment, data used by the localization module 408 includes high-precision maps of the roadway geometric properties, maps describing road network connectivity properties, maps describing roadway physical properties (such as traffic speed, traffic volume, the number of vehicular and cyclist traffic lanes, lane width, lane traffic directions, or lane marker types and locations, or combinations of them), and maps describing the spatial locations of road features such as crosswalks, traffic signs or other travel signals of various types.

The control module 406 receives the data representing the trajectory 414 and the data representing the AV position 418 and operates the control functions 420a-c (e.g., steering, throttling, braking, ignition) of the AV in a manner that will cause the AV 100 to travel the trajectory 414 to the destination 412. For example, if the trajectory 414 includes a left turn, the control module 406 will operate the control functions 420a-c in a manner such that the steering angle of the steering function will cause the AV 100 to turn left and the throttling and braking will cause the AV 100 to pause and wait for passing pedestrians or vehicles before the turn is made.

Autonomous Vehicle Inputs

Figure 5:
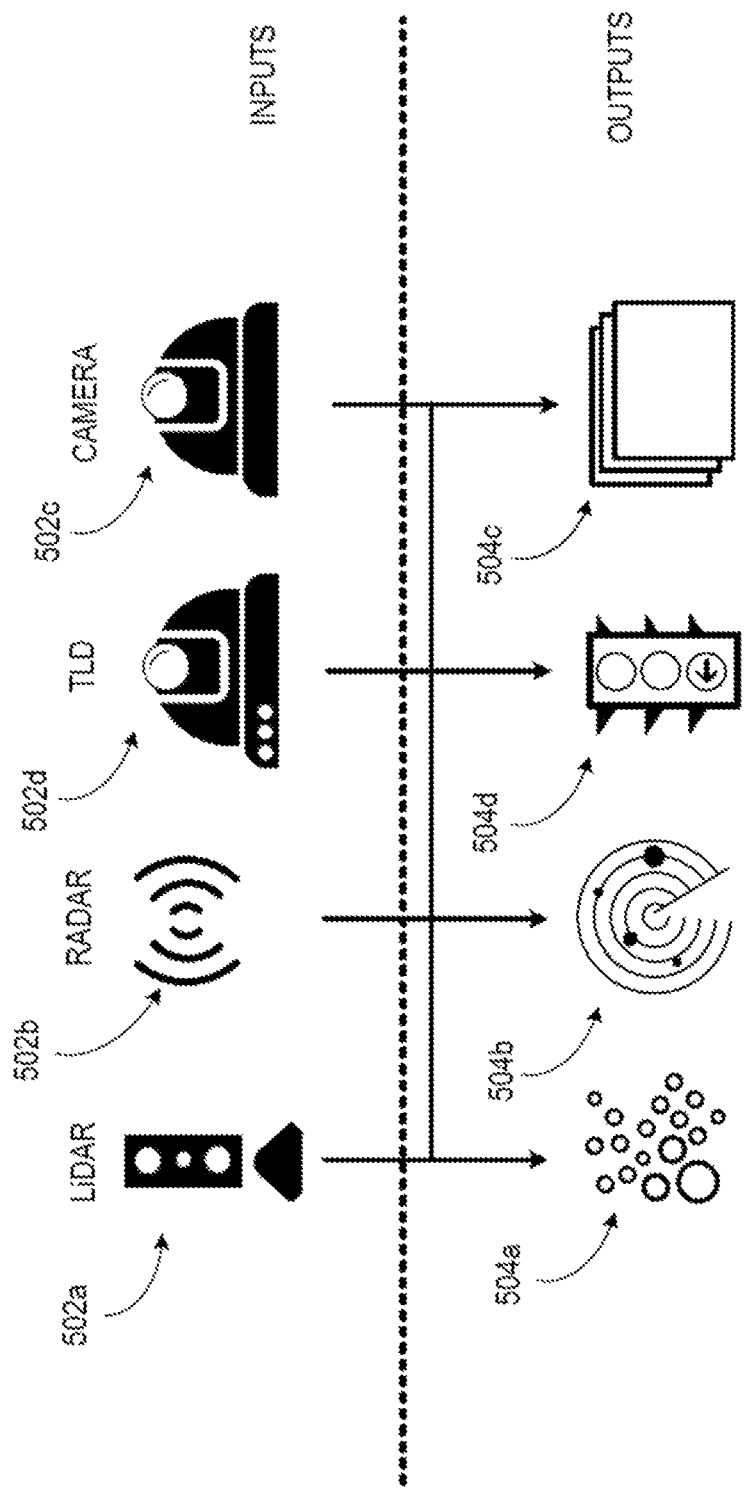
FIG. 5 shows an example of inputs and outputs that may be used by a perception module.

FIG. 5 shows an example of inputs 502*a-d* (e.g., sensors 121 shown in FIG. 1) and outputs 504*a-d* (e.g., sensor data) that is used by the perception module 402 (FIG. 4). One input 502*a* is a LiDAR (Light Detection and Ranging) system (e.g., LiDAR 123 shown in FIG. 1). LiDAR is a technology that uses light (e.g., bursts of light such as infrared light) to obtain data about physical objects in its line of sight. A LiDAR system produces LiDAR data as output 504*a*. For example, LiDAR data is collections of 3D or 2D points (also known as a point clouds) that are used to construct a representation of the environment 190.

Another input 502*b* is a RADAR system. RADAR is a technology that uses radio waves to obtain data about nearby physical objects. RADARs can obtain data about objects not within the line of sight of a LiDAR system. A RADAR system 502*b* produces RADAR data as output 504*b*. For example, RADAR data are one or more radio frequency electromagnetic signals that are used to construct a representation of the environment 190.

Another input 502*c* is a camera system. A camera system uses one or more cameras (e.g., digital cameras using a light sensor such as a charge-coupled device [CCD]) to obtain information about nearby physical objects. A camera system produces camera data as output 504*c*. Camera data often takes the form of image data (e.g., data in an image data format such as RAW, JPEG, PNG, etc.). In some examples, the camera system has multiple independent cameras, e.g., for the purpose of stereopsis (stereo vision), which enables the camera system to perceive depth. Although the objects perceived by the camera system are described here as "nearby," this is relative to the AV. In use, the camera system may be configured to "see" objects far, e.g., up to a kilometer or more ahead of the AV. Accordingly, the camera system may have features such as sensors and lenses that are optimized for perceiving objects that are far away.

Another input 502*d* is a traffic light detection (TLD) system. A TLD system uses one or more cameras to obtain information about traffic lights, street signs, and other physical objects that provide visual navigation information. A TLD system produces TLD data as output 504*d*. TLD data often takes the form of image data (e.g., data in an image data format such as RAW, JPEG, PNG, etc.). A TLD system differs from a system incorporating a camera in that a TLD system uses a camera with a wide field of view (e.g., using a wide-angle lens or a fish-eye lens) in order to obtain information about as many physical objects providing visual navigation information as possible, so that the AV 100 has access to all relevant navigation information provided by these objects. For example, the viewing angle of the TLD system may be about 120 degrees or more.

In some embodiments, outputs 504*a-d* are combined using a sensor fusion technique. Thus, either the individual outputs 504*a-d* are provided to other systems of the AV 100 (e.g., provided to a planning module 404 as shown in FIG. 4), or the combined output can be provided to the other systems, either in the form of a single combined output or multiple combined outputs of the same type (e.g., using the same combination technique or combining the same outputs or both) or different types type (e.g., using different respective combination techniques or combining different respective outputs or both). In some embodiments, an early fusion technique is used. An early fusion technique is characterized by combining outputs before one or more data processing steps are applied to the combined output. In some embodiments, a late fusion technique is used. A late fusion technique is characterized by combining outputs after one or more data processing steps are applied to the individual outputs.

Figure 6:
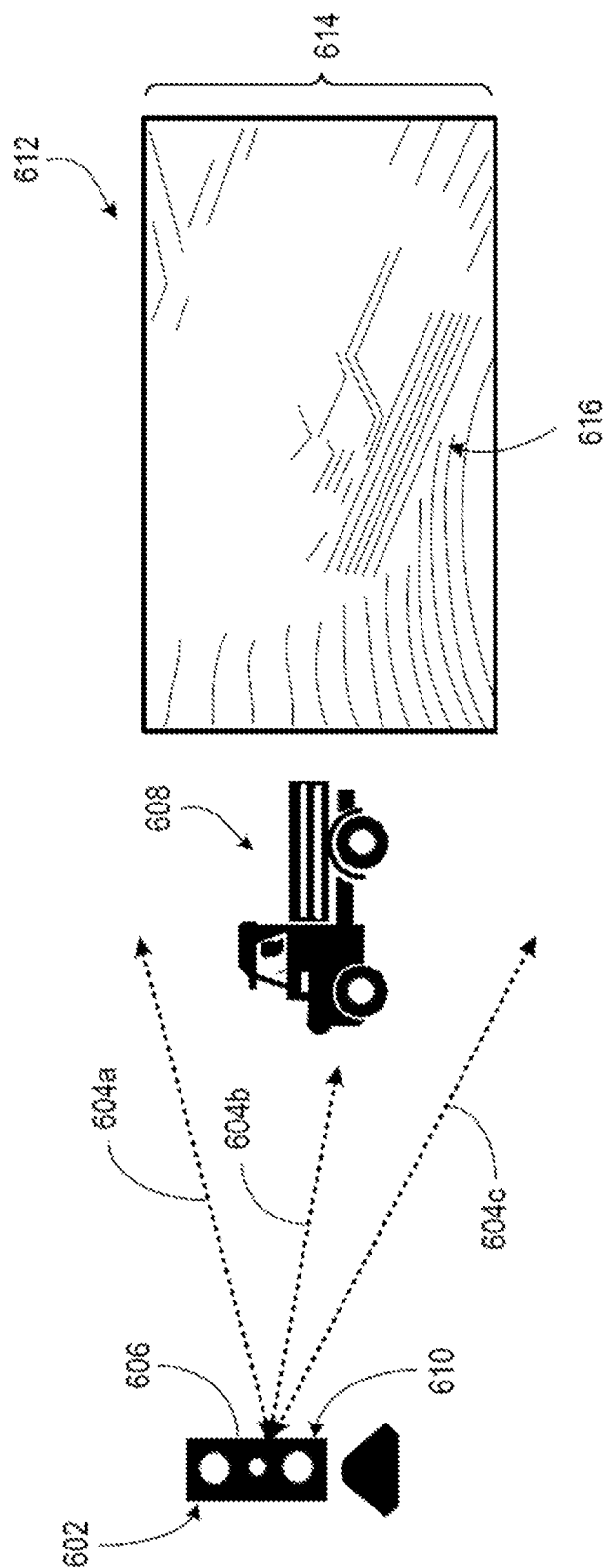
FIG. 6 shows an example of a LiDAR system.

FIG. 6 shows an example of a LiDAR system 602 (e.g., the input 502*a* shown in FIG. 5). The LiDAR system 602 emits light 604*a-c* from a light emitter 606 (e.g., a laser transmitter). Light emitted by a LiDAR system is typically not in the visible spectrum; for example, infrared light is often used. Some of the light 604*b* emitted encounters a physical object 608 (e.g., a vehicle) and reflects back to the LiDAR system 602. (Light emitted from a LiDAR system typically does not penetrate physical objects, e.g., physical objects in solid form.) The LiDAR system 602 also has one or more light detectors 610, which detect the reflected light. In an embodiment, one or more data processing systems associated with the LiDAR system generates an image 612 representing the field of view 614 of the LiDAR system. The image 612 includes information that represents the boundaries 616 of a physical object 608. In this way, the image 612 is used to determine the boundaries 616 of one or more physical objects near an AV.

Figure 7:
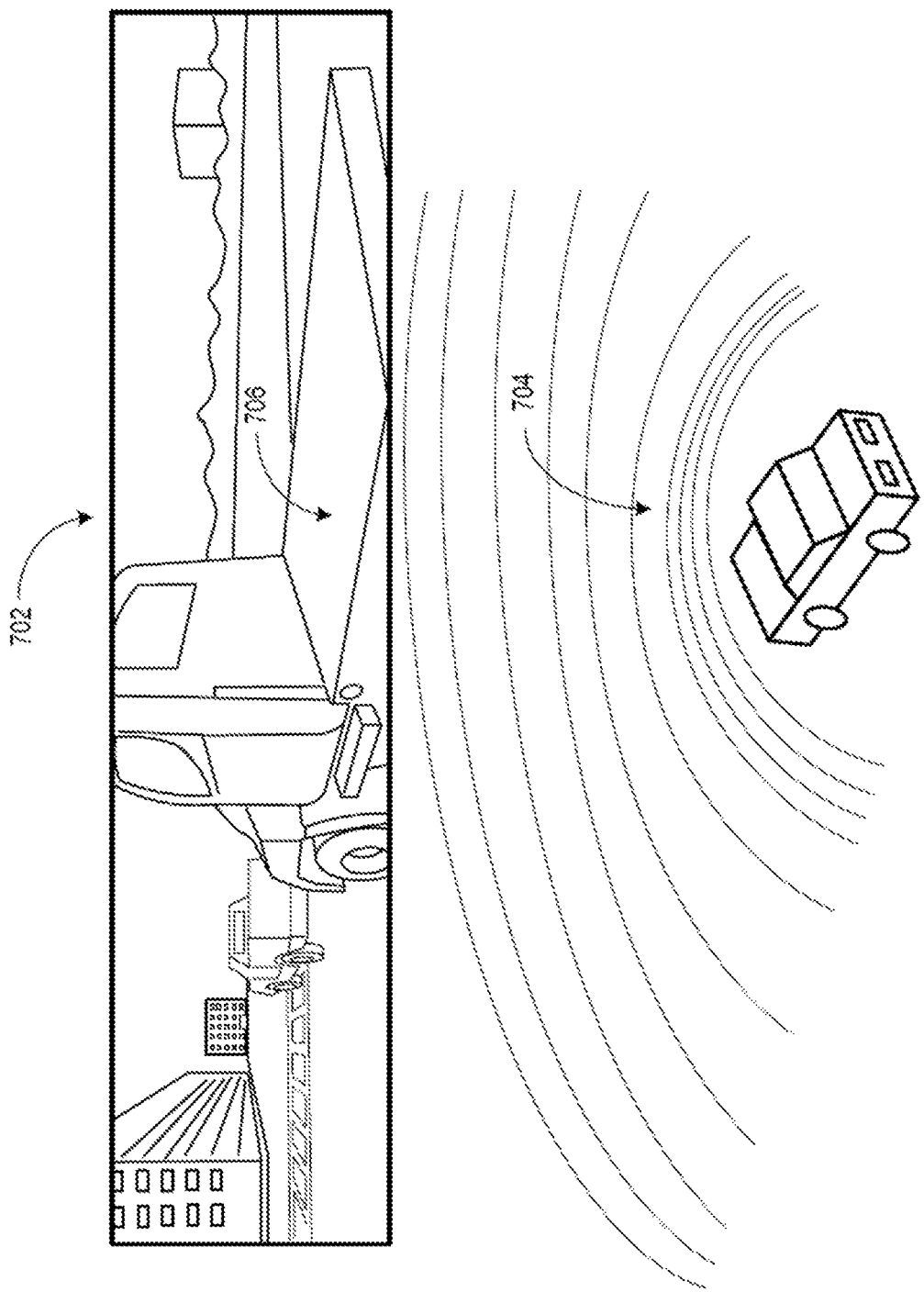
FIG. 7 shows the LiDAR system in operation.

FIG. 7 shows the LiDAR system 602 in operation. In the scenario shown in this figure, the AV 100 receives both camera system output 504*c* in the form of an image 702 and LiDAR system output 504*a* in the form of LiDAR data points 704. In use, the data processing systems of the AV 100 compares the image 702 to the data points 704. In particular, a physical object 706 identified in the image 702 is also identified among the data points 704. In this way, the AV 100 perceives the boundaries of the physical object based on the contour and density of the data points 704.

Figure 8:
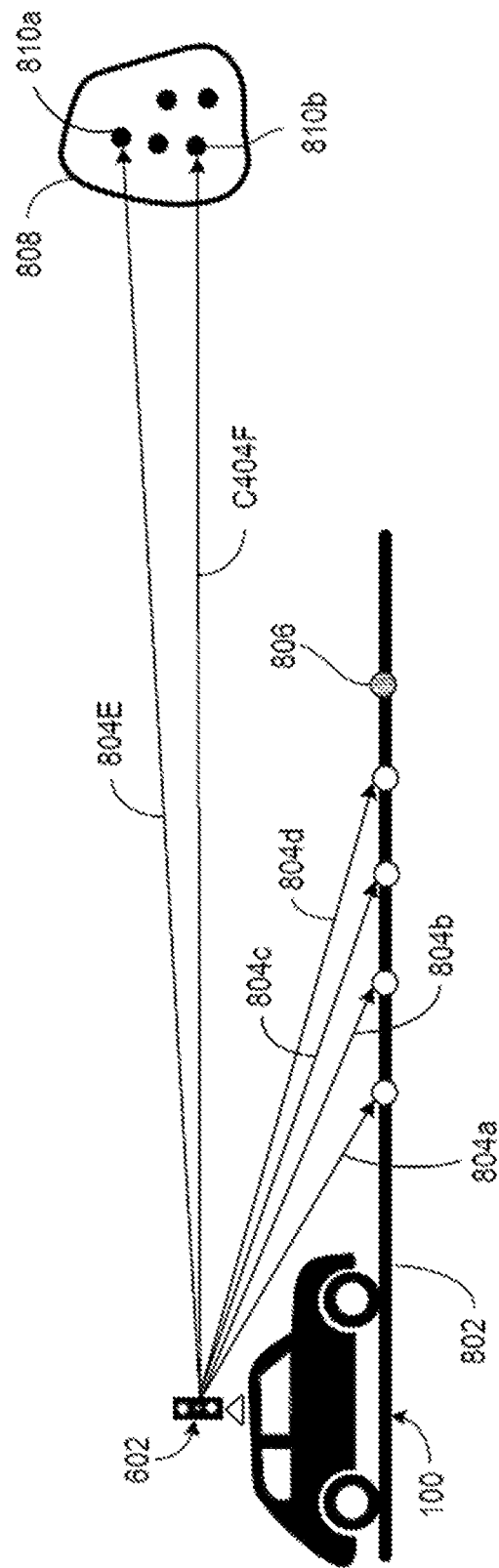
FIG. 8 shows the operation of the LiDAR system in additional detail.

FIG. 8 shows the operation of the LiDAR system 602 in additional detail. As described above, the AV 100 detects the boundary of a physical object based on characteristics of the data points detected by the LiDAR system 602. As shown in FIG. 8, a flat object, such as the ground 802, will reflect light 804*a-d* emitted from a LiDAR system 602 in a consistent manner. Put another way, because the LiDAR system 602 emits light using consistent spacing, the ground 802 will reflect light back to the LiDAR system 602 with the same consistent spacing. As the AV 100 travels over the ground 802, the LiDAR system 602 will continue to detect light reflected by the next valid ground point 806 if nothing is obstructing the road. However, if an object 808 obstructs the road, light 804*e-f* emitted by the LiDAR system 602 will be reflected from points 810*a-b* in a manner inconsistent with the expected consistent manner. From this information, the AV 100 can determine that the object 808 is present.

Path Planning

Figure 9:
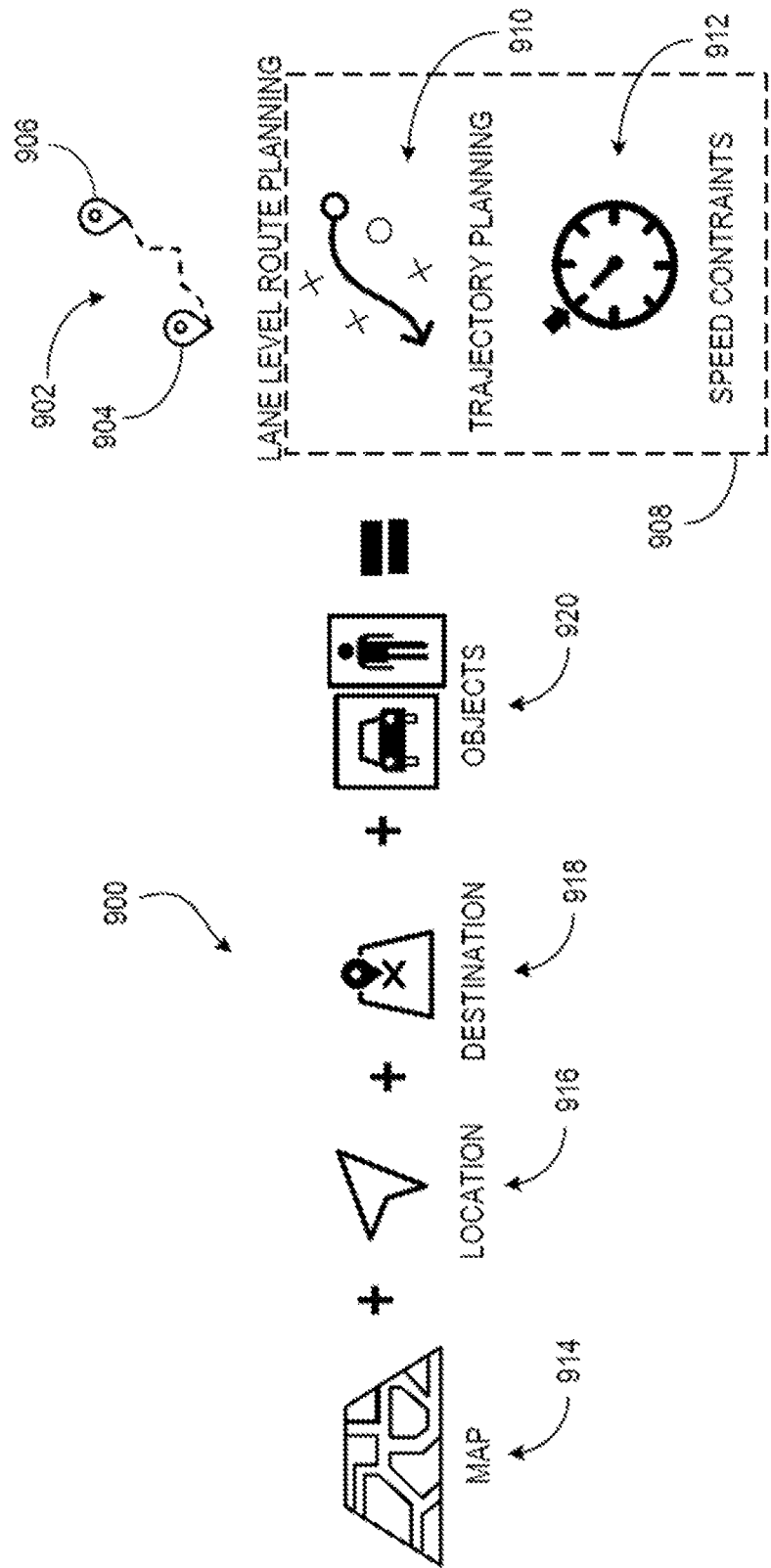
FIG. 9 shows a block diagram of the relationships between inputs and outputs of a planning module.

FIG. 9 shows a block diagram 900 of the relationships between inputs and outputs of a planning module 404 (e.g., as shown in FIG. 4). In general, the output of a planning module 404 is a route 902 from a start point 904 (e.g., source location or initial location), and an end point 906 (e.g., destination or final location). The route 902 is typically defined by one or more segments. For example, a segment is a distance to be traveled over at least a portion of a street, road, highway, driveway, or other physical area appropriate for automobile travel. In some examples, e.g., if the AV 100 is an off-road capable vehicle such as a four-wheel-drive (4WD) or all-wheel-drive (AWD) car, SUV, pick-up truck, or the like, the route 902 includes "off-road" segments such as unpaved paths or open fields.

In addition to the route 902, a planning module also outputs lane-level route planning data 908. The lane-level route planning data 908 is used to traverse segments of the route 902 based on conditions of the segment at a particular time. For example, if the route 902 includes a multi-lane highway, the lane-level route planning data 908 includes trajectory planning data 910 that the AV 100 can use to choose a lane among the multiple lanes, e.g., based on whether an exit is approaching, whether one or more of the lanes have other vehicles, or other factors that vary over the course of a few minutes or less. Similarly, in some implementations, the lane-level route planning data 908 includes speed constraints 912 specific to a segment of the route 902. For example, if the segment includes pedestrians or unexpected traffic, the speed constraints 912 may limit the AV 100 to a travel speed slower than an expected speed, e.g., a speed based on speed limit data for the segment.

In an embodiment, the inputs to the planning module 404 includes database data 914 (e.g., from the database module 410 shown in FIG. 4), current location data 916 (e.g., the AV position 418 shown in FIG. 4), destination data 918 (e.g., for the destination 412 shown in FIG. 4), and object data 920 (e.g., the classified objects 416 as perceived by the perception module 402 as shown in FIG. 4). In some embodiments, the database data 914 includes rules used in planning. Rules are specified using a formal language, e.g., using Boolean logic. In any given situation encountered by the AV 100, at least some of the rules will apply to the situation. A rule applies to a given situation if the rule has conditions that are met based on information available to the AV 100, e.g., information about the surrounding environment. Rules can have priority. For example, a rule that says, "if the road is a freeway, move to the leftmost lane" can have a lower priority than "if the exit is approaching within a mile, move to the rightmost lane."

Figure 10:
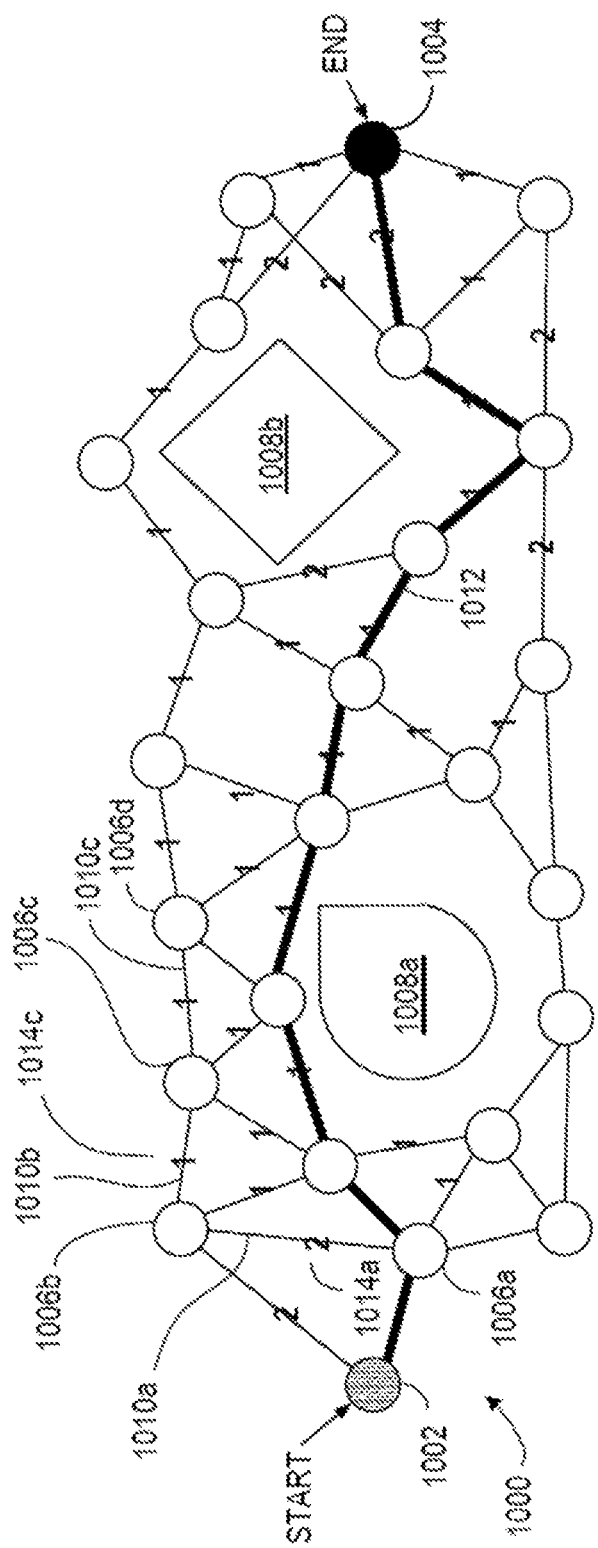
FIG. 10 shows a directed graph used in path planning.

FIG. 10 shows a directed graph 1000 used in path planning, e.g., by the planning module 404 (FIG. 4). In general, a directed graph 1000 like the one shown in FIG. 10 is used to determine a path between any start point 1002 and end point 1004. In real-world terms, the distance separating the start point 1002 and end point 1004 may be relatively large (e.g, in two different metropolitan areas) or may be relatively small (e.g., two intersections abutting a city block or two lanes of a multi-lane road).

In an embodiment, the directed graph 1000 has nodes 1006a-d representing different locations between the start point 1002 and the end point 1004 that could be occupied by an AV 100. In some examples, e.g., when the start point 1002 and end point 1004 represent different metropolitan areas, the nodes 1006a-d represent segments of roads. In some examples, e.g., when the start point 1002 and the end point 1004 represent different locations on the same road, the nodes 1006a-d represent different positions on that road. In this way, the directed graph 1000 includes information at varying levels of granularity. In an embodiment, a directed graph having high granularity is also a subgraph of another directed graph having a larger scale. For example, a directed graph in which the start point 1002 and the end point 1004 are far away (e.g., many miles apart) has most of its information at a low granularity and is based on stored data, but also includes some high granularity information for the portion of the graph that represents physical locations in the field of view of the AV 100.

The nodes 1006a-d are distinct from objects 1008a-b which cannot overlap with a node. In an embodiment, when granularity is low, the objects 1008a-b represent regions that cannot be traversed by automobile, e.g., areas that have no streets or roads. When granularity is high, the objects 1008a-b represent physical objects in the field of view of the AV 100, e.g., other automobiles, pedestrians, or other entities with which the AV 100 cannot share physical space. In an embodiment, some or all of the objects 1008a-b are a static objects (e.g., an object that does not change position such as a street lamp or utility pole) or dynamic objects (e.g., an object that is capable of changing position such as a pedestrian or other car).

The nodes 1006a-d are connected by edges 1010a-c. If two nodes 1006a-b are connected by an edge 1010a, it is possible for an AV 100 to travel between one node 1006a and the other node 1006b, e.g., without having to travel to an intermediate node before arriving at the other node 1006b. (When we refer to an AV 100 traveling between nodes, we mean that the AV 100 travels between the two physical positions represented by the respective nodes.) The edges 1010a-c are often bidirectional, in the sense that an AV 100 travels from a first node to a second node, or from the second node to the first node. In an embodiment, edges 1010a-c are unidirectional, in the sense that an AV 100 can travel from a first node to a second node, however the AV 100 cannot travel from the second node to the first node. Edges 1010a-c are unidirectional when they represent, for example, one-way streets, individual lanes of a street, road, or highway, or other features that can only be traversed in one direction due to legal or physical constraints.

In an embodiment, the planning module 404 uses the directed graph 1000 to identify a path 1012 made up of nodes and edges between the start point 1002 and end point 1004.

An edge 1010a-c has an associated cost 1014a-b. The cost 1014a-b is a value that represents the resources that will be expended if the AV 100 chooses that edge. A typical resource is time. For example, if one edge 1010a represents a physical distance that is twice that as another edge 1010b, then the associated cost 1014a of the first edge 1010a may be twice the associated cost 1014b of the second edge 1010b. Other factors that affect time include expected traffic, number of intersections, speed limit, etc. Another typical resource is fuel economy. Two edges 1010a-b may represent the same physical distance, but one edge 1010a may require more fuel than another edge 1010b, e.g., because of road conditions, expected weather, etc.

When the planning module 404 identifies a path 1012 between the start point 1002 and end point 1004, the planning module 404 typically chooses a path optimized for cost, e.g., the path that has the least total cost when the individual costs of the edges are added together.

Autonomous Vehicle Control

Figure 11:
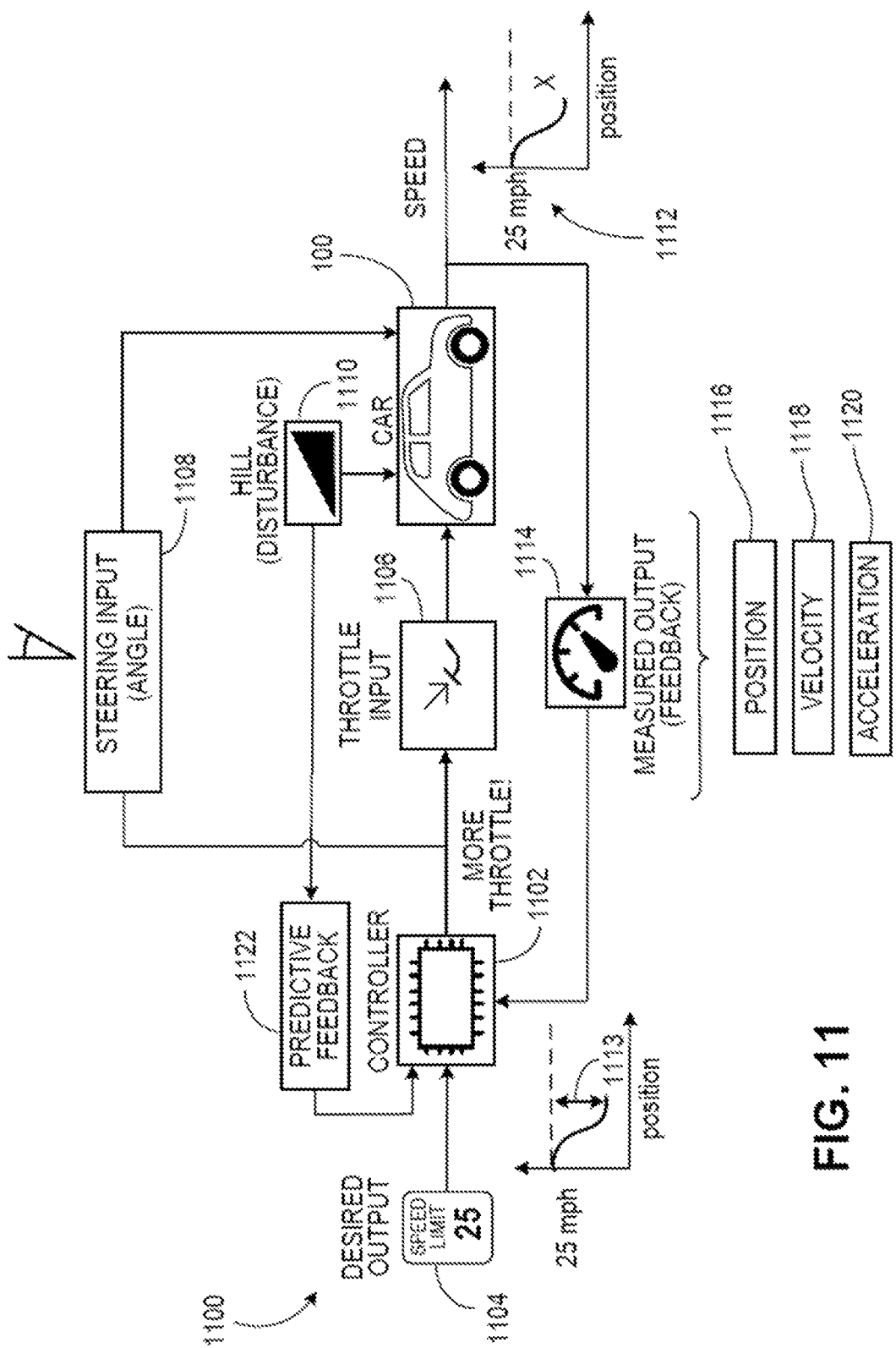
FIG. 11 shows a block diagram of the inputs and outputs of a control module.

FIG. 11 shows a block diagram 1100 of the inputs and outputs of a control module 406 (e.g., as shown in FIG. 4). A control module operates in accordance with a controller 1102 which includes, for example, one or more processors (e.g., one or more computer processors such as microprocessors or microcontrollers or both) similar to processor 304, short-term and/or long-term data storage (e.g., memory random-access memory or flash memory or both) similar to main memory 306, ROM 308, and storage device 210, and instructions stored in memory that carry out operations of the controller 1102 when the instructions are executed (e.g., by the one or more processors).

In an embodiment, the controller 1102 receives data representing a desired output 1104. The desired output 1104 typically includes a velocity, e.g., a speed and a heading. The desired output 1104 can be based on, for example, data received from a planning module 404 (e.g., as shown in FIG. 4). In accordance with the desired output 1104, the controller 1102 produces data usable as a throttle input 1106 and a steering input 1108. The throttle input 1106 represents the magnitude in which to engage the throttle (e.g., acceleration control) of an AV 100, e.g., by engaging the steering pedal, or engaging another throttle control, to achieve the desired output 1104. In some examples, the throttle input 1106 also includes data usable to engage the brake (e.g., deceleration control) of the AV 100. The steering input 1108 represents a steering angle, e.g., the angle at which the steering control (e.g., steering wheel, steering angle actuator, or other functionality for controlling steering angle) of the AV should be positioned to achieve the desired output 1104.

In an embodiment, the controller 1102 receives feedback that is used in adjusting the inputs provided to the throttle and steering. For example, if the AV 100 encounters a disturbance 1110, such as a hill, the measured speed 1112 of the AV 100 is lowered below the desired output speed. In an embodiment, any measured output 1114 is provided to the controller 1102 so that the necessary adjustments are performed, e.g., based on the differential 1113 between the measured speed and desired output. The measured output 1114 includes measured position 1116, measured velocity 1118, (including speed and heading), measured acceleration 1120, and other outputs measurable by sensors of the AV 100.

In an embodiment, information about the disturbance 1110 is detected in advance, e.g., by a sensor such as a camera or LiDAR sensor, and provided to a predictive feedback module 1122. The predictive feedback module 1122 then provides information to the controller 1102 that the controller 1102 can use to adjust accordingly. For example, if the sensors of the AV 100 detect ("see") a hill, this information can be used by the controller 1102 to prepare to engage the throttle at the appropriate time to avoid significant deceleration.

Figure 12:
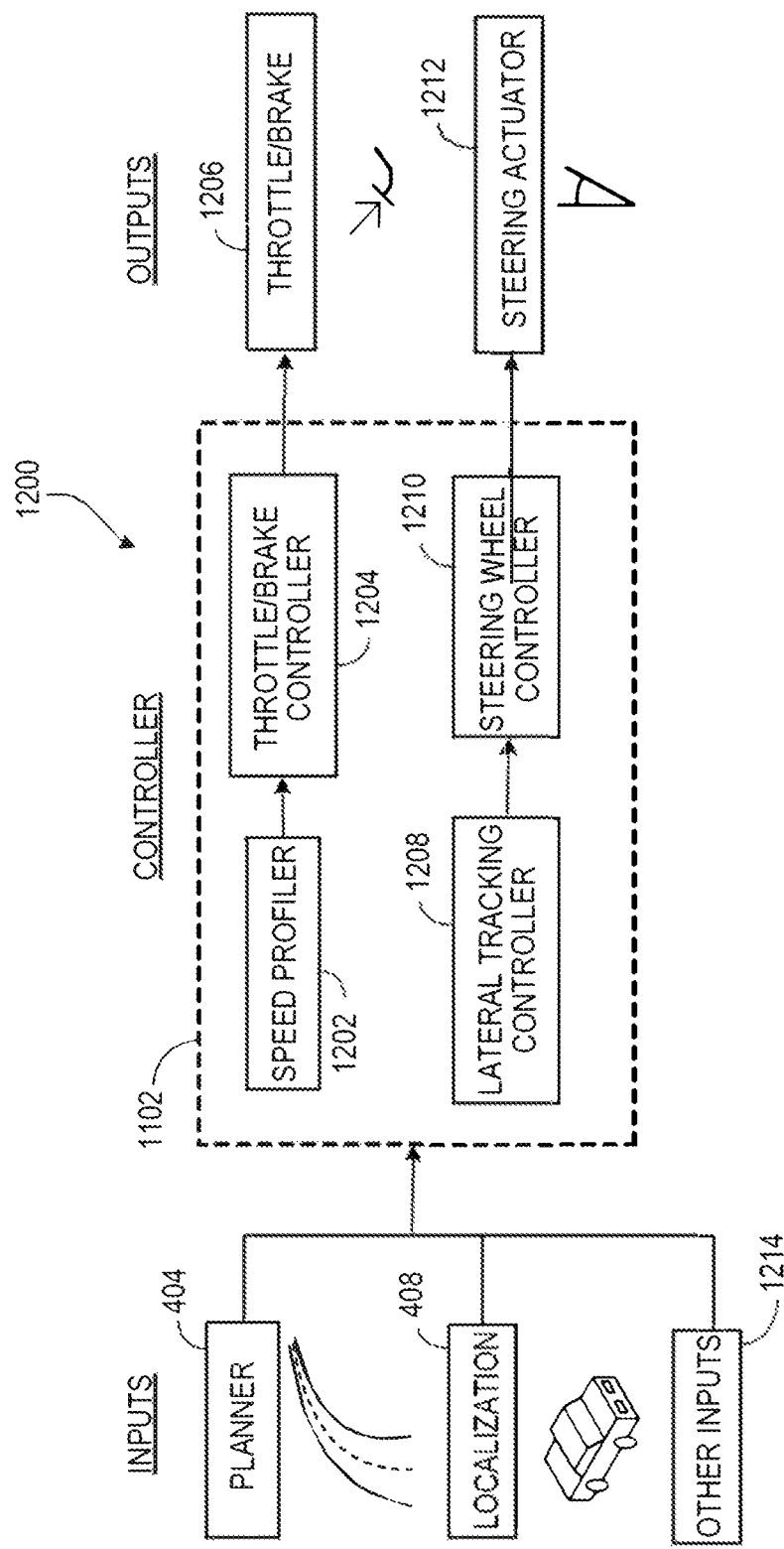
FIG. 12 shows a block diagram of the inputs, outputs, and components of a controller.

FIG. 12 shows a block diagram 1200 of the inputs, outputs, and components of the controller 1102. The controller 1102 has a speed profiler 1202 which affects the operation of a throttle/brake controller 1204. For example, the speed profiler 1202 instructs the throttle/brake controller 1204 to engage acceleration or engage deceleration using the throttle/brake 1206 depending on, e.g., feedback received by the controller 1102 and processed by the speed profiler 1202.

The controller 1102 also has a lateral tracking controller 1208 which affects the operation of a steering controller 1210. For example, the lateral tracking controller 1208 instructs the steering controller 1210 to adjust the position of the steering angle actuator 1212 depending on, e.g., feedback received by the controller 1102 and processed by the lateral tracking controller 1208.

The controller 1102 receives several inputs used to determine how to control the throttle/brake 1206 and steering angle actuator 1212. A planning module 404 provides information used by the controller 1102, for example, to choose a heading when the AV 100 begins operation and to determine which road segment to traverse when the AV 100 reaches an intersection. A localization module 408 provides information to the controller 1102 describing the current location of the AV 100, for example, so that the controller 1102 can determine if the AV 100 is at a location expected based on the manner in which the throttle/brake 1206 and steering angle actuator 1212 are being controlled. In an embodiment, the controller 1102 receives information from other inputs 1214, e.g., information received from databases, computer networks, etc.

AV System Component Cooling

Figure 13:
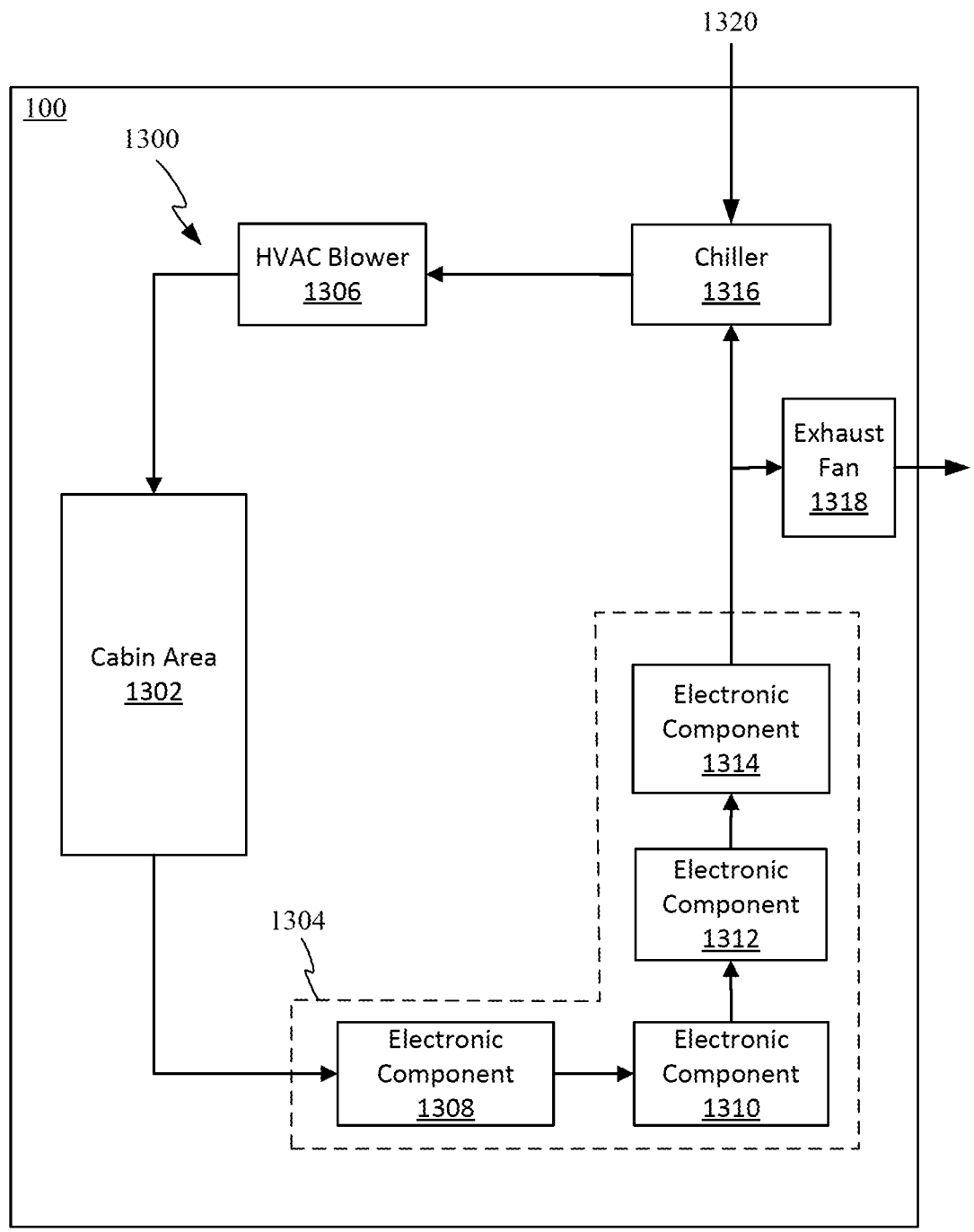
FIG. 13 shows a schematic illustration of a cooling system configured to dissipate heat generated by electronic components supporting an AV system using conditioned cabin air.

FIG. 13 shows a schematic illustration of an exemplary cooling system 1300 configured to dissipate heat generated by electronic components supporting AV system 120 using conditioned cabin air. In particular, conditioned air disposed within cabin area 1302 is drawn into ducting 1304 by operation of heating, ventilation, and air conditioning (HVAC) blower 1306 and optionally additional fans disposed within ducting 1304. Electronic components 1308-1314 can take the form of computing components and circuitry suitable for supporting the implementation of automated driving functionality. In some embodiments, electronic components 1308-1314 can include some or all of the components described in FIG. 3, including processors 304, memory 306, storage device 310 and communication interface 318. Additional electronic components could include a DC-DC converter for adapting electrical energy supplied by AV 100 to the voltages required by the other electronic components 1308-1314 supporting AV system 120. Given that it may be desirable to prevent passengers from inadvertently contacting or bumping these components, electrical components 1308-1314 can be positioned within their own compartment. It should be noted that ducting 1304 can be configured to hold more or less than four electronic components and the four electronic components depicted are depicted for exemplary purposes only.

Since electronic components 1308-1314 are capable of generating substantial amounts of heat, placement of electronic components 1308-1314 within a sealed compartment could cause overheating of electronic components 1308-1314. In some embodiments, a temperature conditioning system is included in the compartment to prevent overheating of electronic components 1308-1314. In the embodiment depicted in FIG. 13, the compartment is integrated with the air conditioning system of the vehicle by incorporating electronic components 1308-1314 into ducting 1304, which delivers conditioned cabin air back into the vehicular air conditioning system. Prior to being delivered back into cabin area 1302, a temperature regulating component taking the form of a chiller 1316 is configured to reduce the temperature of the warmed cabin air to a desired cabin temperature. In instances where chiller 1316 is unable to return all of the cabin air warmed by electronic components 1308-1314 to the desired cabin temperature, exhaust fan 1318 can be configured to draw some or all of the warmed cabin air out of AV 100. In some embodiments, the air exhausted out of AV 100 can be replaced by fresh air from outside the vehicle. This can be particularly desirable where a temperature of the heated cabin air is greater than a temperature of air outside of AV 100, in which case fresh air 1320 can be delivered to chiller 1316 through an external air intake vent of AV 100. While the air intake is shown delivering fresh air directly to chiller 1316, fresh air 1320 could be added at any point within cooling system 1300.

Figure 14:
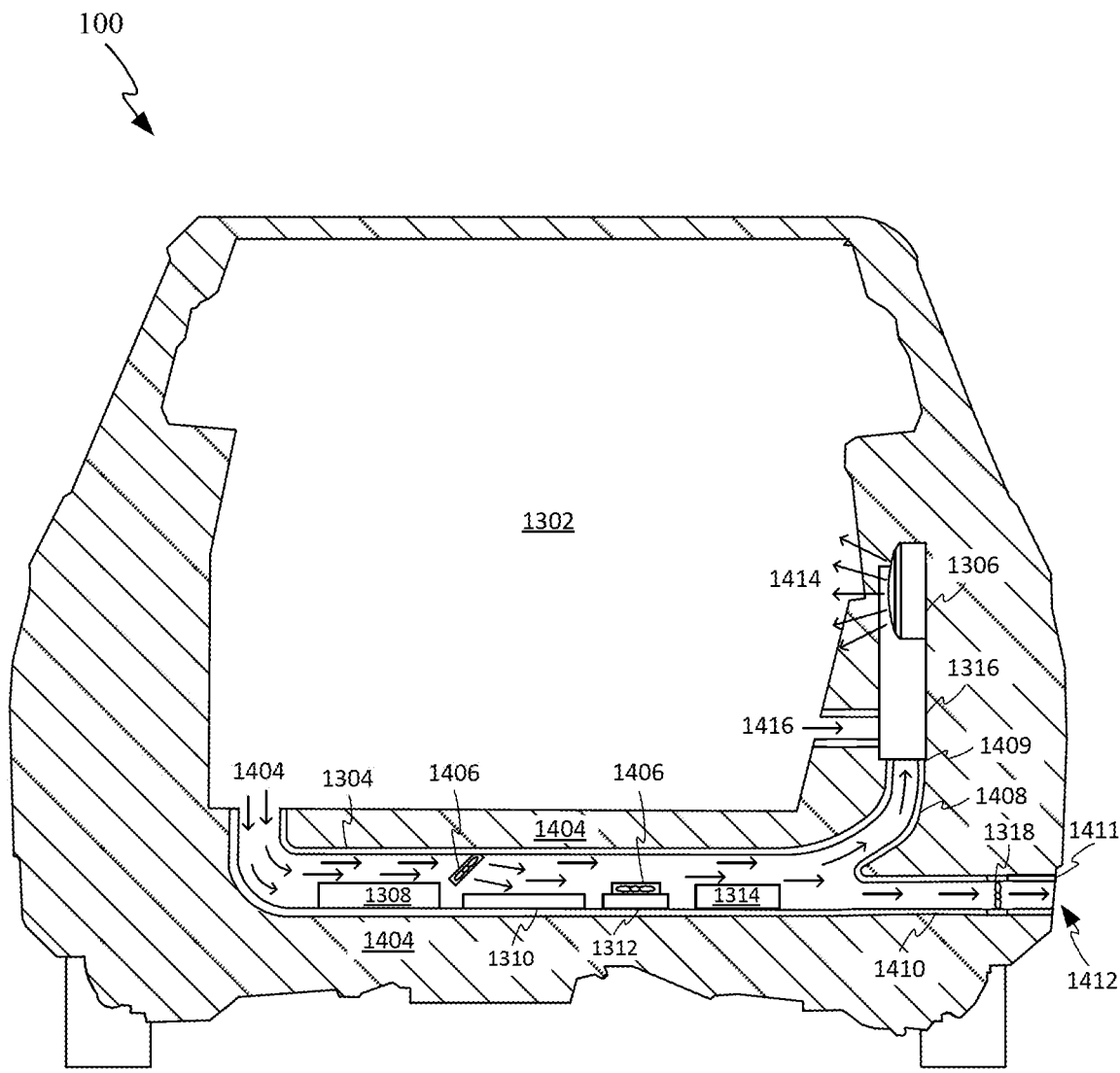
FIG. 14 shows a cross-sectional view of AV 100 that includes one possible configuration of the cooling system depicted in FIG. 13.

FIG. 14 shows a cross-sectional view of AV 100 that includes one possible configuration of cooling system 1300. In particular, ducting 1304 and electronic components 1308-1314 are incorporated within a floor region 1402 of AV 100. Conditioned cabin air 1404 is shown being drawn from cabin area 1302 and into ducting 1304 through a vent in floor region 1404 of AV 100. As conditioned air 1404 flows through ducting 1304, its temperature gradually increases as it convectively dissipates heat generated by electronic components 1308-1314. In some embodiments, auxiliary fans 1406 are distributed along ducting 1304. Auxiliary fans 1406 can be configured to increase a rate at which the conditioned air flows through ducting 1304 and to help direct the conditioned air flowing through ducting 1304 toward and across heated surfaces of electronic components 1308-1314. In some embodiments, one of auxiliary fans 1406 is positioned atop one of the electronic components, as depicted with electronic component 1312, to help dissipate heat into the air flowing through ducting 1304. Components that generate the most heat can be placed nearer to the entrance of ducting 1304 so that a temperature of the conditioned air is at a relatively lower temperature and able to dissipate heat from those components more quickly.

FIG. 14 also shows how ducting 1304 includes a first branch 1408 that guides the heated air to chiller 1316 and a second branch 1410 that guides the heated air out of AV 100 through exhaust vent 1412 located at an exit point 1411 of branch 1410. In some embodiments, exhaust vent 1412 is cosmetically concealed by an exterior panel of AV 100. The heated air can be distributed between branches 1408 and 1410 in many ways. In some embodiments, exhaust vent 1412 can be closed to prevent heated air from leaving AV 100, thereby allowing all or substantially all of the heated air to be routed through chiller 1316. Closing exhaust vent 1412 can be helpful when passengers within AV 100 would like to increase a temperature of air within cabin area 1302. In such a case, operation of chiller 1316 could be at least temporarily halted to allow all of the heated air to flow through chiller 1316 without being cooled so that the heated air is able to warm passengers seated in cabin area 1302. In some embodiments, an operating state of exhaust fan 1318 and blower 1306 can be modulated to achieve a desired amount of heated air leaving AV 100. For example, by operating blower 1306 at high speed and operating exhaust fan 1318 at low speed a majority of the heated air can be routed through chiller 1316, while only a small portion of the heated air is exhausted through exhaust vent 1412. In some embodiments, an air intake of chiller 1316 can be closed to halt air from flowing into chiller 1316 through an exit point 1409 of branch 1408. In this way, all (or nearly all) of the heated air can be exhausted from AV 100 through exhaust vent 1412. In such a case, air from outside AV could be used to replace the air being exhausted through exhaust vent 1412. In some embodiments, the distribution of heated air between branches 1408 and 1410 can be determined based on readings from a temperature sensor disposed within ducting 1304 and proximate branches 1408 and 1410. In some embodiments, in accordance with a determination that the temperature setting is above a temperature setting threshold, air flowing through a duct 1304 can be directed to a first exit point 1409. In some embodiments, in accordance with a determination that the temperature setting is below a temperature setting threshold, at least a portion of the air can be directed to a second exit point 1411.

Chiller 1316 can include an air handler that directs the warmed air arriving from branch 1408 across cooling coils of chiller 1316 to reduce a temperature of the air prior to blower 1306 directing reconditioned air 1414 back into cabin area 1302. Chiller 1316 can also be configured to draw cabin air directly back into chiller 1316 without it having to travel through ducting 1304. This may be desirable where it is preferable to circulate cold ambient air through ducting 1304 rather than drawing cabin air through ducting 1304. Cold ambient air could be introduced into ducting 1304 through an exterior vent positioned along the bottom of or near another exterior surface of AV 100. This could be beneficial where the outside air is much colder than the air within cabin area 1302. Recirculating air within cabin area 1302 directly to chiller 1316 can also be beneficial when a majority of the cabin air being drawn through ducting 1304 is ejected from AV 100 through exhaust vent 1412 in lieu of directing it back through chiller 1316. It should be noted that in some embodiments, chiller 1316 can take the form of a combination heating/cooling unit that can also be configured to increase the temperature of air drawn through ducting 1304.

Figure 15:
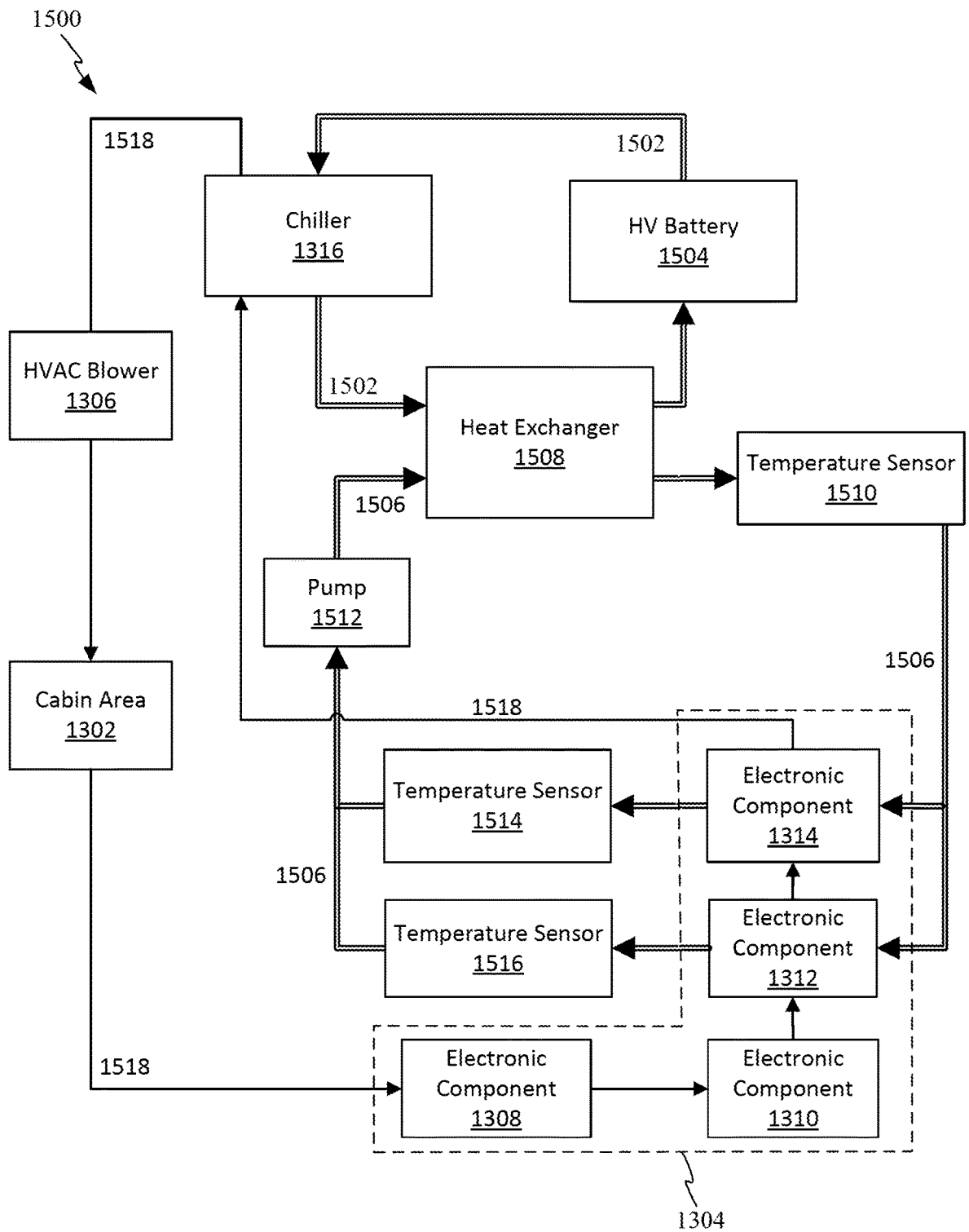
FIG. 15 shows a schematic view of an alternative cooling system in which some electronic components are cooled by both air cooling and liquid cooling.

FIG. 15 shows a schematic view of an exemplary cooling system 1500 in which some of electronic components 1308-1314 are cooled by both air cooling and liquid cooling. In some embodiments, chiller 1316, in addition to reducing the temperature of air being routed through ducting 1304, is also configured to reduce the temperature of a liquid coolant within liquid cooling loop 1502 that is used to regulate the temperature of a hybrid vehicle (HV) battery 1504. It should be noted that the system used to regulate the temperature of HV battery 1504 can be more complex and include additional components such as a pumping mechanism and other supporting components, which are left out for clarity. Prior to the liquid coolant being delivered to HV battery 1504, the liquid coolant within liquid cooling loop 1502 can be used to dissipate heat from liquid coolant within liquid cooling loop 1506 as it is cycled through heat exchanger 1508. Heat exchanger 1508 can take the form of a liquid to liquid heat exchanger that in some embodiments, includes two parallel channels that facilitate that transfer of heat between liquid coolant in liquid cooling loops 1502 and 1506. When the liquid coolant within liquid cooling loop 1506 exits heat exchanger 1508, its temperature is sampled by temperature sensor 1510. A temperature of the liquid coolant, as well as operating temperatures of electronic components 1312 and 1314, can be used to adjust the pressure within liquid cooling loop 1506 and the speed at which liquid travels through liquid cooling loop 1506. For example, it may be desirable to increase the pressure within cooling loop 1506 by changing the operating parameters of pump 1512 in order to increase the rate at which heat is withdrawn from electronic components 1312 and 1314. It should be noted that operation of pump 1512 can also be dictated by readings taken be temperature sensors 1514 and 1516, which provide a measure of how much heat is being dissipated from electronic components 1312 and 1314.

Liquid cooling loop 1506 can be configured to supply liquid coolant into liquid cooling ports of electronic components 1312 and 1314. In some embodiments, electronic components 1312 and 1314 can take the form of a computing device and a DC to DC converter, respectively. While only two electronic components are depicted as being configured to dissipate heat to coolant within liquid cooling loop 1506, a larger or smaller number of components could be configured to dissipate heat to liquid coolant within liquid cooling loop 1506.

It should also be noted that an amount of heat dissipated by liquid coolant within liquid cooling loop 1506 can be dependent on an efficiency of the air cooling provided by conditioned air flowing through air cooling loop 1518. Air cooling efficiency can be highly dependent on a temperature of air within the cabin area of AV 100. In some embodiments, and as discussed below, limits may be placed upon the allowable range of temperatures selectable by passengers riding within the cabin area to avoid a situation in which air cooling loop 1518 is unable to provide a sufficient amount of cooling to keep electronic components 1308-1314 within predetermined operating parameter ranges.

Exemplary Process for Controlling Operation of an HVAC System of AV 100

Figure 16:
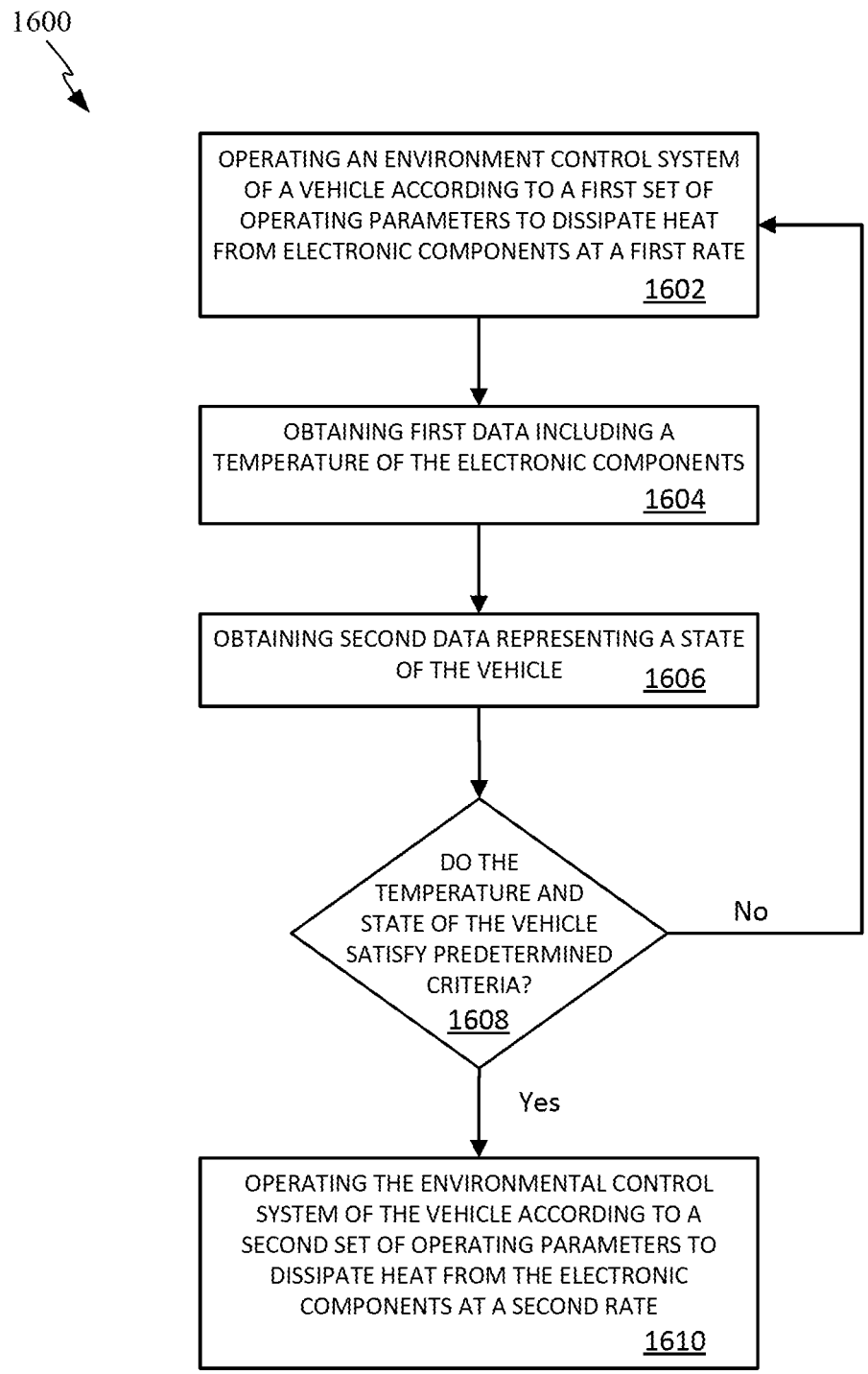
FIG. 16 is a flow chart of an exemplary process for controlling operation of an environmental control system of an AV.

FIG. 16 is a flow chart of an exemplary process 1600 for controlling operation of an environmental control system of AV 100. For convenience, process 1600 is described as being performed by a system of one or more computers located in one or more locations. At 1602, the environmental control system is operated according to a first set of operating parameters (e.g., fan speed, desired cabin temperature, desired cabin zone temperature, defrost mode, desired humidity, recirculation mode, seat heater/cooler mode). Operation of the environmental control system draws air from an interior of the cabin area of AV 100 across electronic components supporting autonomous operation of AV 100. The first set of operating parameters dictate at least a rate at which the air is drawn across the electronic components and an amount of heat that is removed from the heated air prior to it being recirculated into the cabin area.

At 1604, first data representing a temperature of the electronic components is gathered. This temperature may be measured at regular intervals or only when passengers riding within AV 100 request a change to the operation of the environmental control system. For example, the temperature measurement could be initiated when a passenger within AV 100 requests an increase to a temperature within AV 100. First data can also include other measurements such as a CPU load of one or more of the electronic components and a flow rate of the air passing over the electronic components.

At 1606, second data representing a state of AV 100 is gathered. The second data can include many different types of information including but not limited to cabin temperature, ambient air temperature, HVAC blower speed, HVAC temperature settings, and vehicle speed. In some embodiments, the second data is gathered any time the first data is gathered, while in other embodiments, operating parameters of the environmental control system are changed solely on the first data. For example, a temperature reading indicating that one or more of the electronic components are running outside of their predetermined operating temperature ranges can result in an immediate change of the first set of operating parameters. In some embodiments, the first data and the second data are sampled or collected concurrently.

At 1608, a determination is made of whether the temperature of the electronic components and the state of the vehicle satisfy predetermined criteria. For example, in a case where the sensor measurements were not initiated in response to a passenger request to change the environmental control system settings, satisfaction of the predetermined criteria could amount to the temperature of one or more of the electronic components being outside of their normal operating ranges (e.g., a predefined range or a range determined based on historical temperature data) and/or a sensor measurement associated with the state of the vehicle indicating an out of parameters situation. In some embodiments, when the sensor measurements are initiated by a user request to change one or more operating parameters of the environmental control system and current operating parameters are all within acceptable ranges, the predetermined criteria are based upon how the requested changes are predicted to change the rate of cooling of the electronic components. In accordance with a determination that the predetermined criteria is met, the process continues to 1610; and in accordance with a determination that the predetermined criteria are not met, the process continues to 1602 where the operating parameters of the environmental control system remain the same.

At 1610, operating parameters of the environmental control system are changed from the first set of operating parameters to a second set of operating parameters. In some embodiments, the second set of operating parameters dictate at least a rate at which air is drawn across the electronic components and an amount of heat that is removed from the heated air prior to it being recirculated into the cabin area that are different from the rate and amount of heat associated with the first set of operating parameters. In the case of the situation where a user has requested a specific change in the operating parameters of the environmental control system, the second operating parameters may not be the same as the requested operating parameters. For example, a passenger within AV 100 may request that a temperature within the cabin area be increased by five degrees. However, in a case where a temperature of one or more of the electronic components is near an upper limit of its operating range, a processor responsible for operation of the environmental control system could predict that a full five degree increase in the cabin area would result in a situation in which the one or more electronic components would begin to operate outside its predetermined operating range and begin to overheat. The processor could be configured to approve less than the full amount of requested cabin area temperature change in such a situation. For example, an increase of three degrees could be authorized rather than the full five degree change. In vehicles having multi-zone cooling, the cabin area temperature changes might only be limited within the zone of the cabin area that includes the air intake that draws conditioned air into the ducting to flow across the electronic components.

In some embodiments, a user interface of the environmental control system is configured to inform users that a requested change could not be fully implemented. Alternatively, the user interface could be configured to continuously determine and display to a user an allowable range of cabin temperatures to avoid a situation in which a user does not expect a temperature change will be implemented that isn't possible without overheating the electronic components. In some embodiments, the system is configured to authorize the full five degree increase in temperature but informs the user that the HVAC blower would need to operate at a level that exceeds normal background noise constraints.

It should be appreciated that the various settings of the environmental control system and ambient conditions surrounding the AV can all affect the ability to achieve a desired rate of heat dissipation from the electronic components. For example, a speed of the primary blower of the environmental control system might need to be above a minimum fan speed when a temperature within the cabin area is elevated. However, this minimum fan speed is not dependent solely upon the temperature within the cabin area and will also vary based on an amount of processing being done by autonomous vehicle systems, a flow speed of air going through the ducting, the efficiency/state of the chiller, the number of people occupying the autonomous vehicle, whether one or more windows have been left open, the ambient temperature outside the vehicle, and the operating state of one or more other cooling systems within the autonomous vehicle. Similarly, minimum and maximum cabin area temperatures are also affected by the factors listed above. For example, in some embodiments, 75 degrees Fahrenheit could be the maximum allowable cabin area temperature in a particular circumstance, while in other circumstances the maximum allowable cabin area temperature could be 85 degrees Fahrenheit. It should be generally appreciated that the minimum and maximum values for various components can also vary greatly in accordance with sensor readings that monitor some or all of the aforementioned conditions. Furthermore, unexpected changes such as an air intake vent being completely or partially covered or the ducting surrounding the electronic components being partially blocked can also result in degraded cooling performance.

In the foregoing description, embodiments have been described with reference to numerous specific details that may vary from implementation to implementation. The description and drawings are, accordingly, to be regarded in an illustrative rather than a restrictive sense. The sole and exclusive indicator of the scope of the claims, and what is intended by the applicants to be the scope of the claims, is the literal and equivalent scope of the set of claims that issue from this application, in the specific form in which such claims issue, including any subsequent correction. Any definitions expressly set forth herein for terms contained in such claims shall govern the meaning of such terms as used in the claims. In addition, when we use the term "further comprising," in the foregoing description or following claims, what follows this phrase can be an additional step or entity, or a sub-step/sub-entity of a previously-recited step or entity.

What is claimed is:

1. A method for controlling the temperature of electronic components in a vehicle, comprising:
    operating an environmental control system of the vehicle according to a first set of operating parameters, wherein the environmental control system is configured to control air flow to an interior portion of the vehicle and to direct air from the interior portion of the vehicle to a duct that surrounds the electronic components, the duct comprising:
        an entrance configured to receive air from the interior portion of the vehicle,
        a first branch configured to direct air from the entrance back into the interior portion of the vehicle, and
        a second branch configured to direct air from the entrance to an environment outside the vehicle; and
    wherein the environmental control system comprises a blower coupled with the first branch and configured to selectively distribute air through the first branch and the second branch, and
    wherein operating the environmental control system according to the first set of operating parameters is configured to cause the air directed to the electronic components to dissipate heat from the electronic components at a first rate;
    obtaining first data representing a temperature of the electronic components;
    obtaining second data representing a state of the vehicle different from the temperature of the electronic components; and
    in accordance with a determination that the temperature of the electronic components and the state of the vehicle satisfy predetermined criteria, operating the environmental control system according to a second set of operating parameters configured to cause the air directed to the electronic components to dissipate heat from the electronic components at a second rate different from the first rate.

2. The method of claim 1, further comprising:
    regulating a rate at which the air is drawn through the duct by controlling a vehicle fan of the environmental control system proximate to an exit point.

3. The method of claim 1, wherein a plurality of fans are attached to an interior surface of the duct, and wherein the method further comprises:
    biasing a flow of the air toward one or more of the electronic components by activating at least one fan of the plurality of fans.

4. The method of claim 1, wherein the first branch comprises a first exit point configured to direct the air to a temperature regulating component and the second branch comprises a second exit point configured to direct the air to a vent through which the air exits the vehicle, wherein the method further comprises:
    directing the air drawn through the duct to at least one of the first exit point and the second exit point.

5. The method of claim 4, further comprising
    obtaining operating parameters corresponding to a temperature setting of the environmental control system; and
    in accordance with a determination that the temperature setting is above a temperature setting threshold, directing the air flowing through the duct to the first exit point.

6. The method of claim 4, further comprising:
    obtaining operating parameters corresponding to a temperature setting of the environmental control system; and
    in accordance with a determination that the temperature setting is below a temperature setting threshold, directing at least a portion of the air to the second exit point.

7. The method of claim 6, wherein directing at least a portion of the air to the second exit point comprises activating a fan proximate the second exit point to draw at least a portion of the air within the duct though the second exit point and to an exterior area of the vehicle.

8. The method of claim 1, wherein the second set of operating parameters includes a first fan speed for a vehicle fan of the environmental control system that is higher than a second fan speed for the vehicle fan from the first set of operating parameters when the first data indicates the temperature of the electronic components exceeds an operating temperature threshold.

9. The method of claim 1, wherein the obtained second data includes a user setting corresponding to a fan speed associated with a vehicle fan, the method further comprising:
    upon a determination that the fan speed is less than a predetermined minimum fan speed setting, adjusting the fan speed to the predetermined minimum fan speed.

10. The method of claim 1, wherein the obtained second data includes a user setting corresponding to a temperature setting of the environmental control system, further comprising:
    upon a determination that the temperature setting exceeds a predetermined maximum temperature setting, adjusting the temperature setting to correspond to the predetermined maximum temperature setting.

11. The method of claim 1, wherein the obtained first data further represents an air flow speed proximate to the electronic components, wherein the method further comprises:
    monitoring changes in the obtained first data using a first monitoring system;
    and monitoring changes in the obtained second data using a second monitoring system different from the first monitoring system, the second data including a temperature of air within the interior portion of the vehicle.

12. The method of claim 1, further comprising:
cooling a vehicle battery using a first liquid cooling loop; and
cooling one or more of the electronic components using a second liquid cooling loop that receives heat from the one or more electronic components and transfers at least a portion of the heat to the first liquid cooling loop.

13. The method of claim 1, further comprising:
directing the air drawn through the duct toward a temperature regulating component of the environmental control system using a vehicle fan;
changing a temperature of the air using the temperature regulating component;
and directing the air into the interior portion of the vehicle.

14. The method of claim 1, further comprising:
cooling a vehicle battery using a liquid cooling loop, and
transferring heat dissipated from at least one electronic component of the electronic components to the liquid cooling loop.

15. A system, comprising:
a plurality of electronic components in a vehicle;
one or more sensors configured to:
    obtain first data representing a temperature of the plurality of electronic components, and
    obtain second data representing a state of the vehicle different from the temperature of the electronic components; and
an environmental control system of the vehicle, the environmental control system configured to:
    control air flow to an interior portion of the vehicle;
    direct air from the interior portion of the vehicle to a duct that surrounds the electronic components, the duct comprising:
        an entrance configured to receive air from the interior portion of the vehicle,
        a first branch configured to direct air from the entrance back into the interior portion of the vehicle, and
        a second branch configured to direct air from the entrance to an environment outside the vehicle,
        wherein the environmental control system comprises a blower coupled with the first branch and configured to selectively distribute air through the first branch and the second branch;
    operate according to a first set of operating parameters in order to dissipate heat from the electronic components at a first rate; and
    in accordance with a determination that the temperature of the electronic components and the state of the vehicle satisfy predetermined criteria, operate according to a second set of operating parameters in order to dissipate heat from the electronic components at a second rate different from the first rate.

16. The system of claim 15, further comprising:
a temperature regulating component; and
a vehicle fan configured to direct the air into the temperature regulating component, the temperature regulating component being configured to change a temperature of the air prior to directing the air into the interior portion of the vehicle.

17. The system of claim 16, wherein the temperature regulating component is a chiller.

18. A non-transitory computer-readable storage medium storing one or more programs, the one or more programs comprising instructions, which when executed by one or more processors of an electronic device, cause the electronic device to:
operate an environmental control system of a vehicle according to a first set of operating parameters, wherein the environmental control system is configured to control air flow to an interior portion of the vehicle and to direct air from the interior portion of the vehicle to a duct that surrounds electronic components, the duct comprising:
    an entrance configured to receive air from the interior portion of the vehicle, a first branch configured to direct air from the entrance back into the interior portion of the vehicle, and
    a second branch configured to direct air from the entrance to an environment outside the vehicle,
    wherein the environmental control system comprises a blower coupled with the first branch and configured to selectively distribute air through the first branch and the second branch, and wherein operating the environmental control system according to the first set of operating parameters is configured to cause the air to dissipate heat from the electronic components at a first rate;
obtain first data representing a temperature of the electronic components;
obtain second data representing a state of the vehicle different from the temperature of the electronic components; and
in accordance with a determination that the temperature of the electronic components and the state of the vehicle satisfy predetermined criteria, operate the environmental control system according to a second set of operating parameters, wherein operating the environmental control system according to the second set of operating parameters is configured to cause the air to dissipate heat from the electronic components at a second rate different from the first rate.

19. The method of claim 1, wherein the environmental control system further comprises an exhaust fan configured to assist the blower in selectively distributing air through the first branch and the second branch.

* * * * *